(12) United States Patent
Tanaka et al.

(10) Patent No.: US 9,640,330 B2
(45) Date of Patent: May 2, 2017

(54) PHOTOELECTRIC CONVERSION ELEMENT AND SOLAR CELL

(71) Applicants: Yuuji Tanaka, Shizuoka (JP); Tamotsu Horiuchi, Shizuoka (JP)

(72) Inventors: Yuuji Tanaka, Shizuoka (JP); Tamotsu Horiuchi, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/895,772

(22) PCT Filed: Jun. 5, 2014

(86) PCT No.: PCT/JP2014/065521
§ 371 (c)(1),
(2) Date: Dec. 3, 2015

(87) PCT Pub. No.: WO2014/196659
PCT Pub. Date: Dec. 11, 2014

(65) Prior Publication Data
US 2016/0126021 A1    May 5, 2016

(30) Foreign Application Priority Data

Jun. 6, 2013 (JP) .................. 2013-119454
May 7, 2014 (JP) .................. 2014-095911

(51) Int. Cl.
*H01G 9/20* (2006.01)
*H01L 51/00* (2006.01)
*C09B 47/00* (2006.01)

(52) U.S. Cl.
CPC ........... *H01G 9/2059* (2013.01); *C09B 47/00* (2013.01); *H01L 51/0092* (2013.01);
(Continued)

(58) Field of Classification Search
None
See application file for complete search history.

(56) References Cited

U.S. PATENT DOCUMENTS

| 4,927,721 A | 5/1990 | Gratzel et al. |
| 2013/0090469 A1 | 4/2013 | Yeh et al. |

FOREIGN PATENT DOCUMENTS

| EP | 2363868 A2 | 9/2011 |
| JP | 2664194 | 6/1997 |

(Continued)

OTHER PUBLICATIONS

International Search Report Issued Aug. 26, 2014 for counterpart International Patent Application No. PCT/JP2014/065521 filed Jun. 5, 2014.

(Continued)

*Primary Examiner* — Catherine S Branch
(74) *Attorney, Agent, or Firm* — Cooper & Dunham LLP

(57) ABSTRACT

A photoelectric conversion element, including: an electron transporting material; and a porphyrin compound represented by General Formula (1) or (2), wherein the electron transporting material is coated with the porphyrin compound:

(Continued)

General Formula (1)

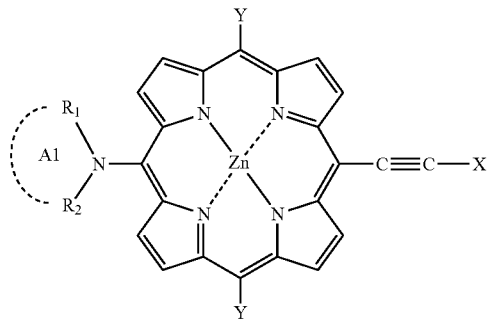

where $R_1$ and $R_2$ each independently denote an aromatic hydrocarbon group which has 6-20 carbon atoms and may have an alkyl or alkoxy group as substituent, $R_1$ and $R_2$ may be bonded to form ring structure A1, X denotes a monovalent group expressed by Structural Formula (I), (II) or (III), and Y denotes a phenyl group which may have an alkyl or alkoxy group as a substituent, General Formula (2)

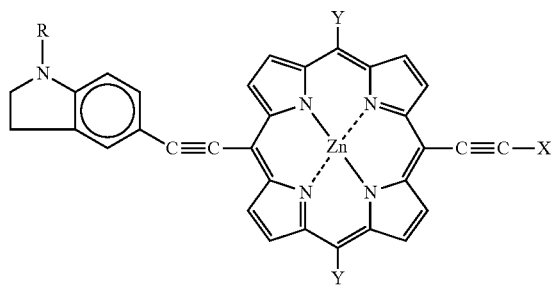

where R denotes an aromatic hydrocarbon group which has 6-20 carbon atoms and may have an alkyl or alkoxy group as substituent, X denotes a monovalent group expressed by Structural Formula (I), (II) or (III), and Y denotes a phenyl group which may have an alkyl or alkoxy group as substituent,

8 Claims, 6 Drawing Sheets

(52) U.S. Cl.
CPC .......... *H01G 9/2031* (2013.01); *Y02E 10/542* (2013.01); *Y02E 10/549* (2013.01)

(56) References Cited

FOREIGN PATENT DOCUMENTS

| JP | 11-086916 | 3/1999 |
|----|-----------|--------|
| JP | 11-238925 | 8/1999 |
| JP | 2010-165545 | 7/2010 |
| JP | 2013-239312 | 11/2013 |
| JP | 2013239312 A * | 11/2013 |
| WO | WO2012/175536 | 12/2012 |

OTHER PUBLICATIONS

B. O'Regan et al., "A low-cost, high-efficiency solar cell based on dye-sensitized colloidal TiO₂ films", Nature, vol. 353 (1991) 737.
M. K. Nazeeruddin et al., "Conversion of Light to Electricity by cis-X₂Bis(2,2'-bipryidyl-4,4'-dicarboxylate)ruthenium(II) Charge-Transfer Sensitizers (X = Cl, Br, I-, Cn-, and ScN) on Nanocrystalline TiO₂ Electrodes", Am. Chem. Soc., vol. 115 (1993) 6382.
K. Sayama et al., "Photosensitization of Porous TiO₂ Semiconductor Electrode with Xanthene Dyes", Chem. Lett., 753 (1998).
S. Ferrere et al., "Dye Sensitization of Nanocrystalline Tin Oxide by Perylene Derivatives", J. Phys. Chem. B, vol. 101, 4490 (1997).
K. Hare et al., "A coumarin-derivative dye sensitized nanocrystalline TIO₂ solar cell having a high solar-energy conversion efficiency up to 5.6%", Chem. Commun., 569 (2001).
K. Hara et al., "Novel polyene dyes for highly efficient dye-sensitized solar cells", Chem. Commun., 252 (2003).
K. Kalyanasundaram et al., "Sensitization of TiO₂ in the Visible Light Region Using Zinc Porphyrins", J. Phys. Chem., vol. 91, 2342 (1987).
Y. Shen et at., "Fabrication, characterization and photovoltaic study of a TiO₂ microporous electrode", Thin. Solid, Films., vol. 57, 144 (1995).
H. Lu et al., "Control of Dye Aggregation and Electron Injection for Highly Efficient Porphyrin Sensitizers Adsorbed on Semiconductor Films with Varying Ratios of Coadsorbate", J. Phys. Chem., vol. 113, 20990 (2009).
Tian-Gao Zhang, et al., "Electronic Modulation of Hyperpolarizable (Porphinato) zinc (II) Chromophores Featuring Ethynylphenyl-, Ethynylthiophenyl-, Ethynylthiazolyl-, and Ethynylbenzothiazolyl-Based Electron-Donating and—Accepting Morieties", Inorganic Chemistry, Oct. 26, 2006, vol. 45, No. 24, 9703-9712.

(56) References Cited

OTHER PUBLICATIONS

S. DiMagno et al., "Facile Elaboration of Poryphyrins via Metal-Mediated Cross-Coupling", J. Org. Chem. 1993, 58, 5983-5993.

X. Shi et al., "3-Cyclobutenyl-1,2-dione-Substituted Porphyrins. A General and Efficient Entry to Porphyrin-Quinone and Quinone-Porphyrin-Quinone Architectures", J. Org. Chem. 2000, 65, 1650-1664.

T. Zhang et al., "Design, Synthesis, Linear, and Nonlinear Optical Properties of Conjugated (Porphinato)zinc(II)-Based Donor-Acceptor Chromophores Featuring Nitrothiophenyl and Nitrooligothiophenyl Electron-Accepting Moieties", J. Am. Chem, Soc. 2005, 124, 9710-9720.

European Search Report official action dated May 18, 2016 in corresponding European Patent Application No. 14807685.4.

Lu H. et al., "Design and characterization of highly efficient porphyrin sensitizers for green see-through dye-sensitized solar cells" Physical Chemistry Chemical Physics, Royal Society of Chemistry, Cambridge, GB, vol. 11, No. 44,(Nov. 28, 2009) pp. 10270-10274.

L. Giribabu, et al., "Functionalized zinc porphyrin as light harvester in dye sensitized solar cells" Journal of Chemical Sciences vol. 120, No. 5, (Sep. 1, 2008), pp. 455-462.

\* cited by examiner

PHOTOELECTRIC CONVERSION ELEMENT AND SOLAR CELL

TECHNICAL FIELD

The present invention relates to a photoelectric conversion element and a solar cell using the same.

BACKGROUND ART

In recent years, importance of solar cells has been increasing as an alternative energy to fossil fuel and as a measure against global warming. However, existing solar cells such as silicon solar cells are costly at present, which is a factor of preventing them from being widely used.

Therefore, research and development on various low-cost solar cells have been advancing. In particular, a dye-sensitized solar cell presented by Graetzel, et al. at Swiss Federal Institute of Technology in Lausanne has increasingly been expected to put into practice (see, for example, PTL 1 and NPLs 1 and 2). The structure of this solar cell is composed of a transparent electroconductive glass substrate; a porous metal oxide semiconductor on the substrate; a sensitizing dye adsorbed on a surface of the semiconductor; an electrolyte containing a redox pair; and a counter electrode. Graetzel, et al. remarkably improved photoelectric conversion efficiency by making porous a metal oxide semiconductor electrode such as titanium oxide to enlarge its surface area and by adsorbing a ruthenium complex as a dye in a monomolecular manner.

However, ruthenium used in the sensitizing dye is a rare metal and has limitation on its amount. Under such circumstances, development has been required for organic dyes having no limitation on their amounts. Sensitizing dyes already proposed include xanthene dyes such as Eosin Y (see NPL 3), perylene dyes (see NPL 4), cyanine dyes (see PTL 2), merocyanine dyes (see PTL 3), coumarin dyes (see NPL 5), polyene dyes (see NPL 6), porphyrin dyes (see NPL 7), and phthalocyanine dyes (see NPL 8).

Xanthene dyes such as Eosin Y and perylene dyes have an absorption wavelength range of up to about 600 nm only, and disadvantageously are low in conversion efficiency. Cyanine dyes, merocyanine dyes, polyene dyes, coumarin dyes, and other dyes have many conjugated double bonds, and hence tend to cause cis-trans isomerization due to light irradiation and disadvantageously are quite low in durability. Porphyrin dyes and phthalocyanine dyes are disadvantageously low in solubility and adsorption intensity onto titanium oxide, and are easily detached from titanium oxide. Phthalocyanine dyes also have difficulty in adapting to titanium oxide in terms of energy level.

Recent reports presented that push-pull porphyrin complexes containing a hole transporting compound (see NPL 9) have quite high conversion efficiency. However, their absorption wavelength range is about 750 nm, and there has been a need to achieve higher conversion efficiency resulting from absorption in longer wavelength.

As described above, at present, none of the sensitizing dyes for dye-sensitized solar cells that have been considered so far has satisfactory properties.

CITATION LIST

Patent Literature

PTL 1: Japanese Patent (JP-B) No. 2664194
PTL 2: Japanese Patent Application Laid-Open (JP-A) No. 11-86916
PTL 3: JP-A No. 11-238925

Non-Patent Literature

NPL 1: Nature, Vol. 353 (1991) 737
NPL 2: J. Am. Chem. Soc., Vol. 115 (1993) 6382
NPL 3: Chem. Lett., 753 (1998)
NPL 4: J. Phys. Chem. B, Vol. 101, 4490 (1997)
NPL 5: Chem. Commun., 569 (2001)
NPL 6: Chem. Commun., 252 (2003)
NPL 7: J. Phys. Chem., Vol. 91, 2342 (1987)
NPL 8: Thin. Solid. Films., Vol. 257, 144 (1995)
NPL 9: J. Phys. Chem., Vol. 113, 20990 (2009)

SUMMARY OF INVENTION

Technical Problem

The present invention aims to solve the above existing problems and achieve the following objects. That is, an object of the present invention is to provide a photoelectric conversion element having high efficiency and high long-term stability.

Solution to Problem

The present inventors conducted extensive studies to solve the above problems, and as a result have found that it is possible to provide a photoelectric conversion element having high efficiency and high long-term stability and have arrived at the present invention.

Means for solving the above problems are as follows.

That is, a photoelectric conversion element of the present invention includes: an electron transporting material; and a porphyrin compound represented by the following General Formula (1) or the following General Formula (2), wherein the electron transporting material is coated with the porphyrin compound:

General Formula (1)

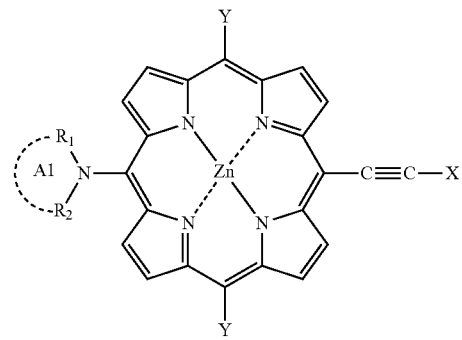

where in General Formula (1), $R_1$ and $R_2$ each independently denote an aromatic hydrocarbon group which has 6 to 20 carbon atoms and may have an alkyl group or an alkoxy group as a substituent, $R_1$ and $R_2$ may be bonded together to form a ring structure denoted by A1, X denotes a monovalent group expressed by the following Structural Formula (I), (II) or (III), and Y denotes a phenyl group which may have an alkyl group or an alkoxy group as a substituent,

General Formula (2)

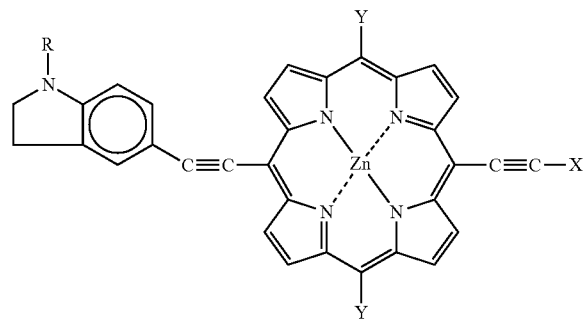

where in General Formula (2), R denotes an aromatic hydrocarbon group which has 6 to 20 carbon atoms and may have an alkyl group or an alkoxy group as a substituent, X denotes a monovalent group expressed by the following Structural Formula (I), (II) or (III), and Y denotes a phenyl group which may have an alkyl group or an alkoxy group as a substituent,

Structural Formula (I)

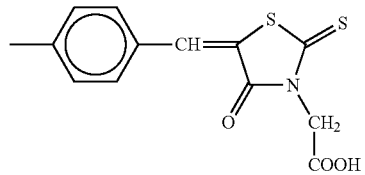

Structural Formula (II)

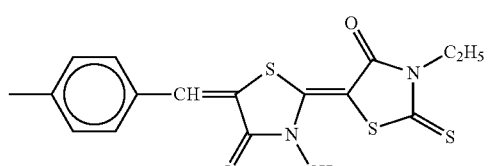

Structural Formula (III)

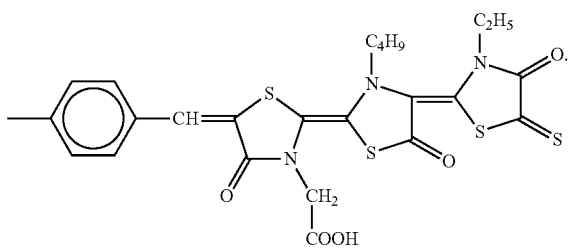

Advantageous Effects of Invention

The present invention can solve the above existing problems and achieve the above object, and can provide a photoelectric conversion element having high efficiency and high long-term stability.

A solar cell of the present invention includes: a first electrode; an electron transporting layer on the first electrode; and a second electrode facing the electron transporting layer, wherein the electron transporting layer is coated with the porphyrin compound having an arylamine group serving as a hole transporting material and a rhodanine group serving as an electron transporting material. As a result, the solar cell can have good properties.

DESCRIPTION OF EMBODIMENTS (Photoelectric Conversion Element)

Figure 1:
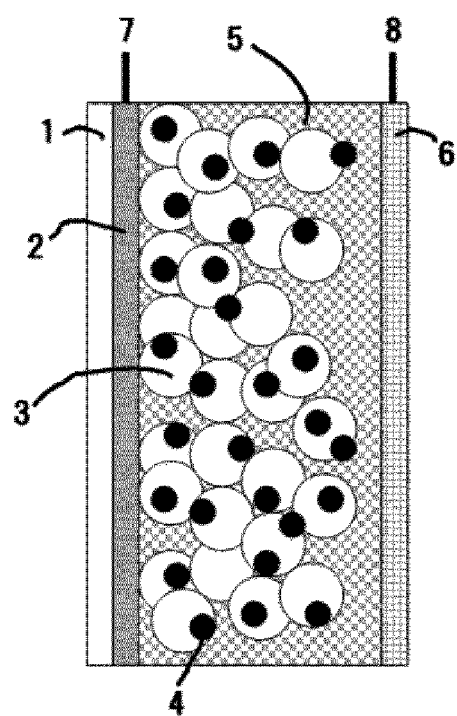
FIG. 1 is a cross-sectional view of an exemplary structure of a dye-sensitized solar cell according to the present invention.

A photoelectric conversion element of the present invention includes an electron transporting material and a porphyrin compound serving as a photosensitizing compound; and, if necessary, further includes other components such as another photosensitizing compound.

The electron transporting material is coated with the porphyrin compound.

<Electron Transporting Material>

The electron transporting material is not particularly limited, and a known electron transporting material (a semiconductor) may be appropriately selected as the electron transporting material depending on the intended purpose.

Examples of the electron transporting material include element semiconductors such as silicon and germanium; compound semiconductors such as chalcogenides of metals; and compounds having a perovskite structure.

Examples of the chalcogenides of metals include oxides of, for example, titanium, tin, zinc, iron, tungsten, zirconium, hafnium, strontium, indium, cerium, yttrium, lanthanum, vanadium, niobium, and tantalum (n-type oxide semiconductors); sulfides of, for example, cadmium, zinc, lead, silver, antimony, and bismuth; selenides of, for example, cadmium and lead; and tellurides of, for example, cadmium.

Preferable examples of the other compound semiconductors include phosphides of, for example, zinc, gallium, indium, and cadmium; and gallium arsenide, copper-indium-selenide, and copper-indium sulfide.

Suitable examples of the compounds having a perovskite structure include strontium titanate, calcium titanate, sodium titanate, barium titanate, and potassium niobate.

Among these, n-type oxide semiconductors are preferable, with titanium oxide, zinc oxide, tin oxide, and niobium oxide being particularly preferable.

These may be used alone or as a mixture of two or more thereof. The crystal form of these semiconductors is not particularly limited and may be monocrystal, multicrystal, or amorphous.

The shape of the electron transporting material is not particularly limited and may be appropriately selected depending on the intended purpose, but is preferably nanoparticles. More preferably, the electron transporting material is an n-type oxide semiconductor formed of nanoparticles.

The size of the nanoparticles of the electron transporting material is not particularly limited but is preferably 1 nm to 100 nm, more preferably 5 nm to 50 nm, as an average particle diameter of primary particles thereof.

It is also possible to improve efficiency by mixing or laminating the nanoparticles of the electron transporting material having a greater average particle diameter to thereby scatter incident light. In this case, the average particle diameter of the nanoparticles thereof is preferably 50 nm to 500 nm.

The average particle diameter of the nanoparticles of the electron transporting material can be calculated in the following manner, for example. Specifically, the particles diameters are calculated from images of their primary particles obtained using a scanning electron microscope (SEM) or a transmission electron microscope (TEM) and are averaged.

<Porphyrin Compound>

The porphyrin compound is a porphyrin compound represented by the following General Formula (1) or the following General Formula (2). These may be used alone or in combination of two or more thereof.

General Formula (1)

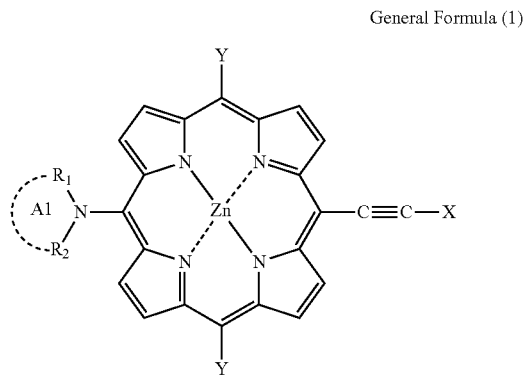

In General Formula (1), $R_1$ and $R_2$ each independently denote an aromatic hydrocarbon group which has 6 to 20 carbon atoms and may have an alkyl group or an alkoxy group as a substituent, $R_1$ and $R_2$ may be bonded together to form a ring structure denoted by A1, X denotes a monovalent group expressed by the following Structural Formula (I), (II) or (III), and Y denotes a phenyl group which may have an alkyl group or an alkoxy group as a substituent.

General Formula (2)

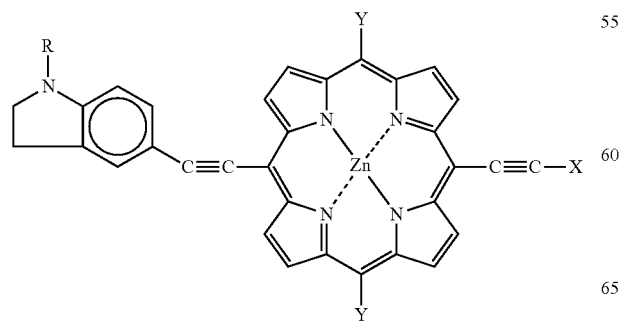

In General Formula (2), R denotes an aromatic hydrocarbon group which has 6 to 20 carbon atoms and may have an alkyl group or an alkoxy group as a substituent, X denotes a monovalent group expressed by the following Structural Formula (I), (II) or (III), and Y denotes a phenyl group which may have an alkyl group or an alkoxy group as a substituent.

Structural Formula (I)

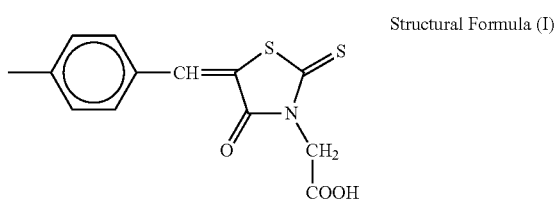

Structural Formula (II)

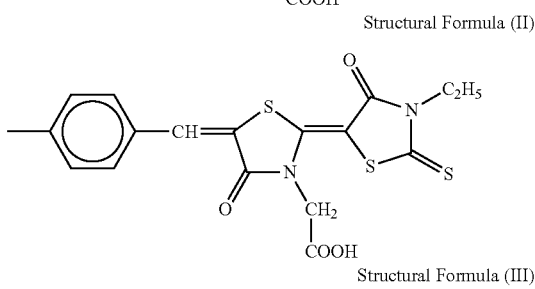

Structural Formula (III)

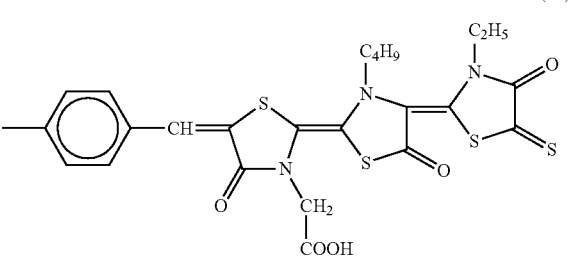

$R_1$ and $R_2$ in General Formula (1) each independently denote an aromatic hydrocarbon group which has 6 to 20 carbon atoms and may have an alkyl group or an alkoxy group as a substituent, and $R_1$ and $R_2$ may be bonded together to form a ring structure denoted by A1.

R in General Formula (2) denotes an aromatic hydrocarbon group which has 6 to 20 carbon atoms and may have an alkyl group or an alkoxy group as a substituent.

Examples of the aromatic hydrocarbon group include a phenyl group, fused polycyclic hydrocarbon groups, and ring assemblies (e.g., compounds where phenyl groups, fused polycyclic hydrocarbon groups, or a phenyl group and a fused polycyclic hydrocarbon group are bonded together via a single bond or a divalent group such as an alkylene group or an alkenylene group). Among these, a phenyl group, a biphenyl group, an α-phenylstilbene group, and the following group are preferable since these groups have an ability to expand π-conjugation three dimensionally.

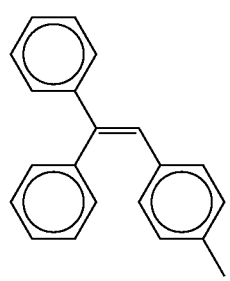

Examples of the alkyl group include linear or branched alkyl groups having 1 to 10 carbon atoms. Among these, a methyl group, a tert-butyl group, and a hexyl group are preferably since these groups have high solubility in organic solvents.

Examples of the alkoxy group include structures (RO—) where the above alkyl groups are bonded to an oxygen atom. Among these, CH$_3$O— and C$_6$H$_{13}$O— are preferable since these groups have high solubility in organic solvents.

$R_1$, $R_2$ or R is not particularly limited and may be appropriately selected depending on the intended purpose, but is preferably the following groups since they have a high ability to inject charges to a hole transporting material.

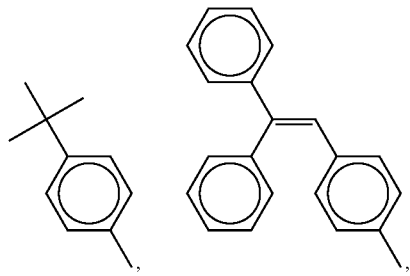

,

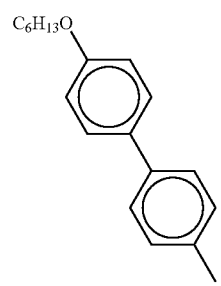

,

Y in General Formula (1) and General Formula (2) is a phenyl group which may have an alkyl group or an alkoxy group as a substituent.

The Y is not particularly limited and may be appropriately selected depending on the intended purpose, but is preferably the following groups.

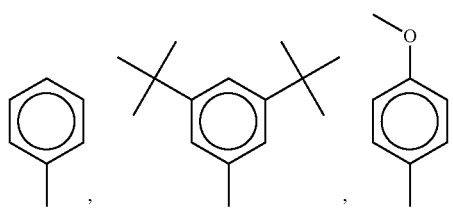

,

Among these, an unsubstituted phenyl group is more preferable since the cost of raw materials is low.

When the Y is an unsubstituted phenyl group, General Formula (1) and General Formula (2) are the following General Formula (1-1) and the following General Formula (2-1), respectively.

General Formula (1-1)

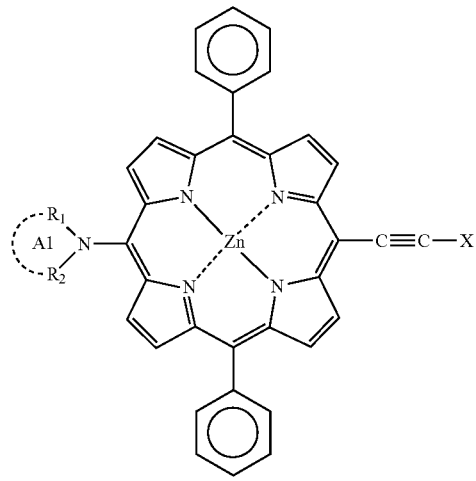

In General Formula (1-1), $R_1$, $R_2$, A1, and X are as defined in General Formula (1), and suitable examples thereof are also the same as in General Formula (1).

General Formula (2-1)

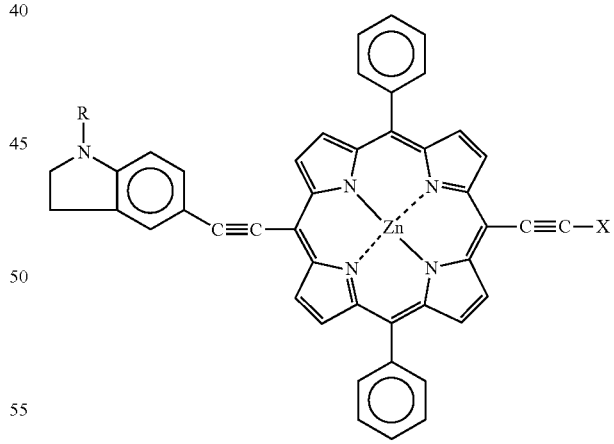

In General Formula (2-1), R and X are as defined in General Formula (2), and suitable examples thereof are also the same as in General Formula (2).

Specific exemplary compounds of General Formula (1) and General Formula (2) are given below, but usable compounds in the present invention are not limited thereto.

TABLE 1
No. 1
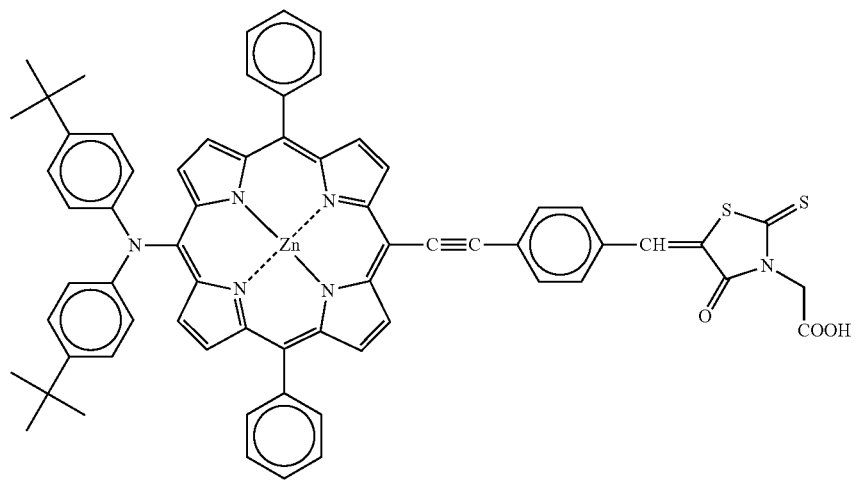
No. 2
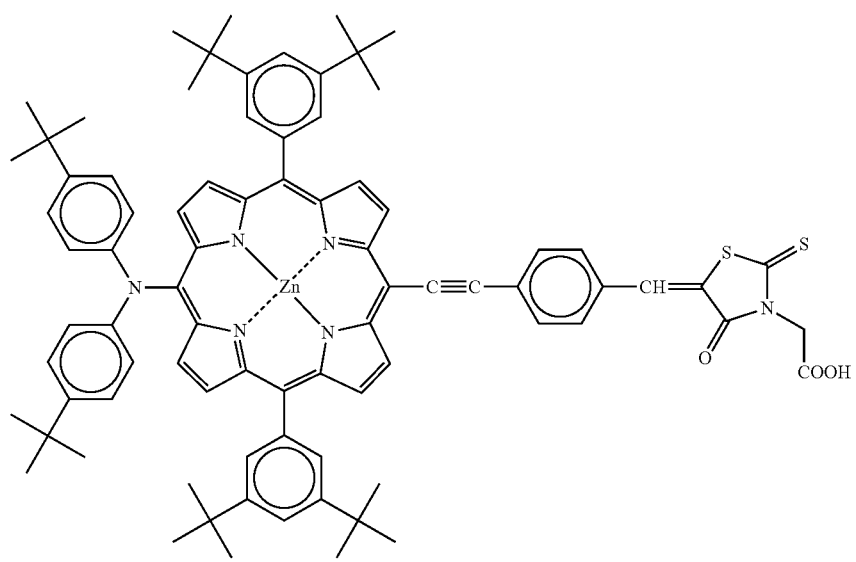
No. 3
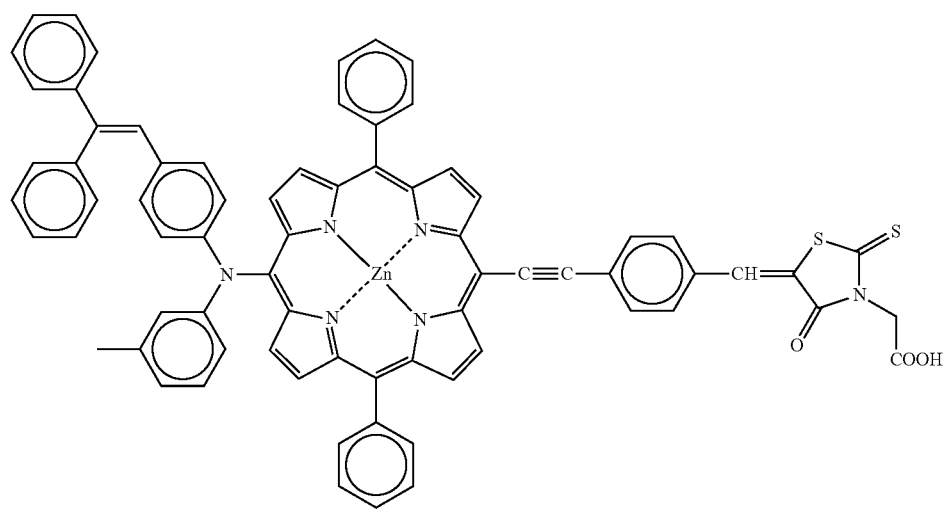

TABLE 1-continued
No. 4
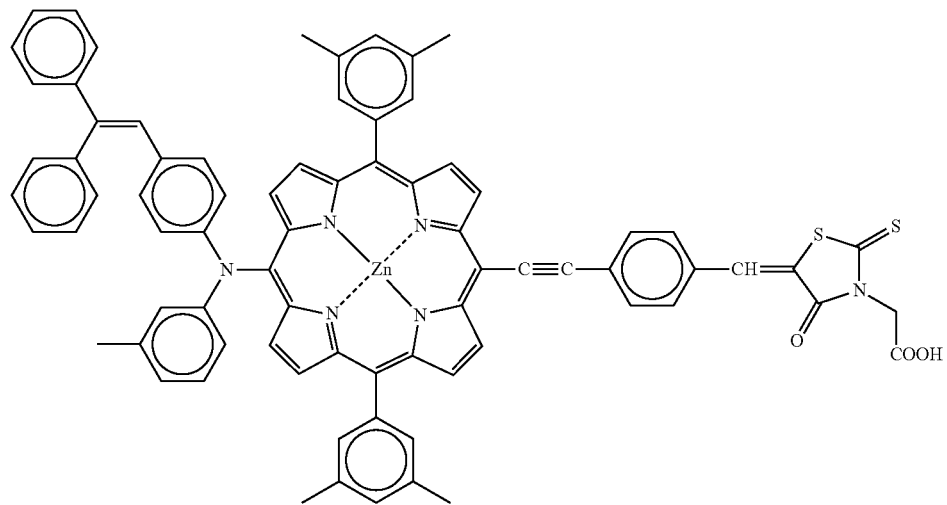
No. 5
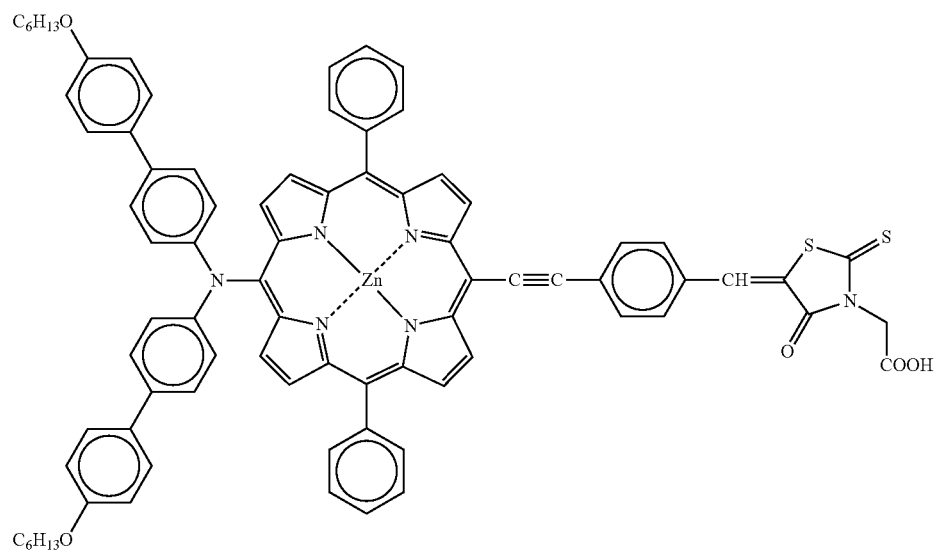

TABLE 1-continued
No. 6
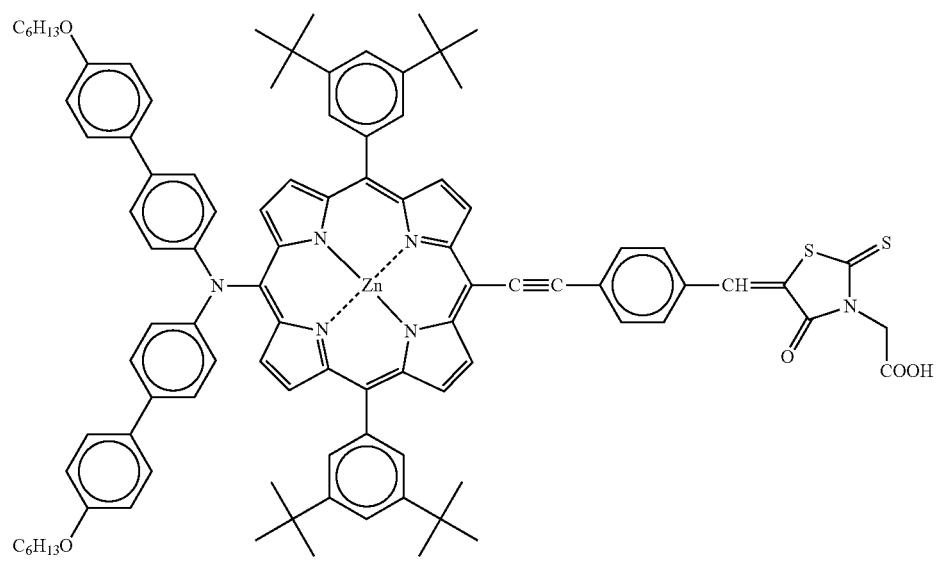
No. 7
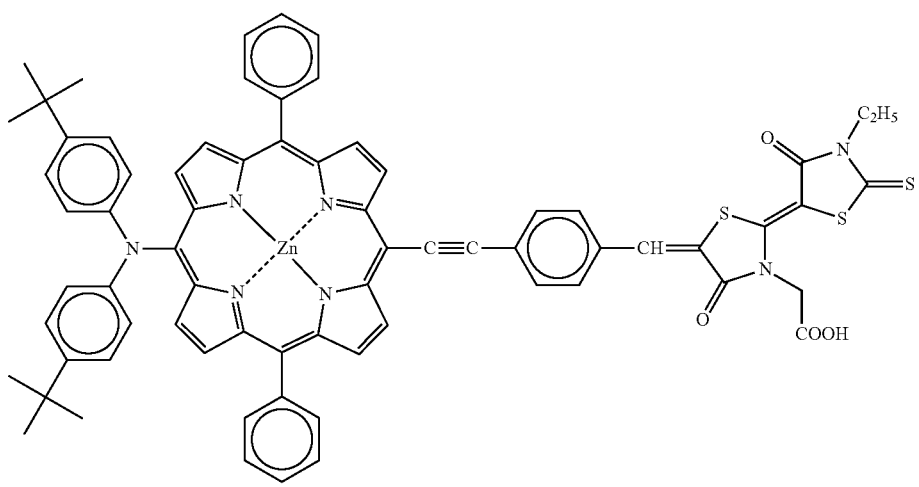

TABLE 1-continued
No. 8
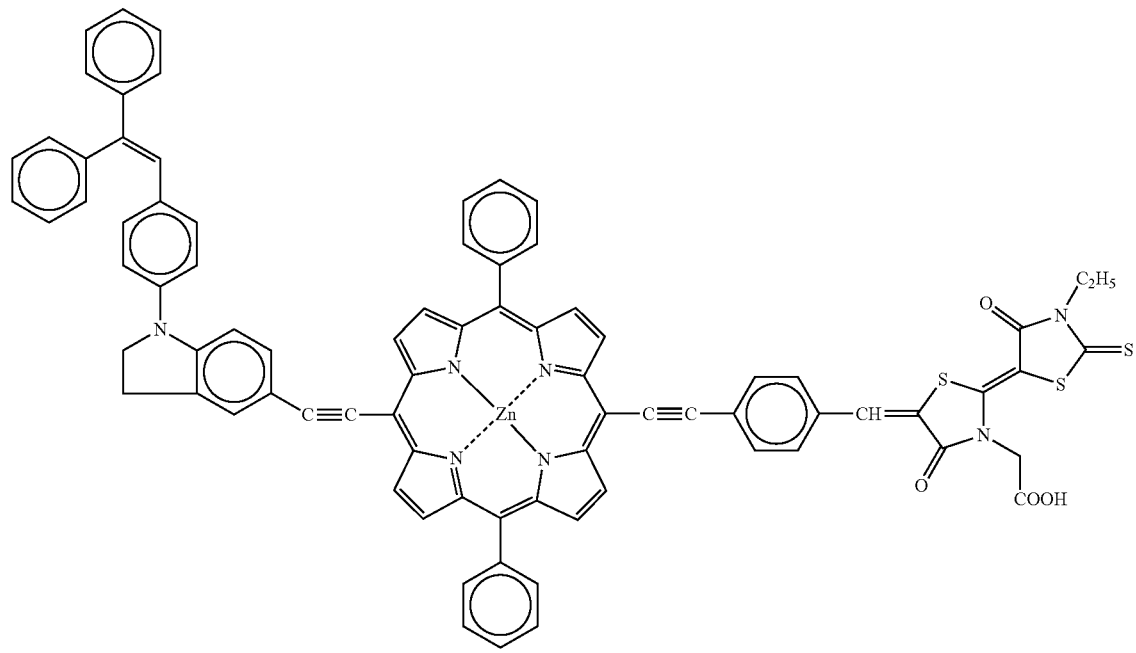
No. 9
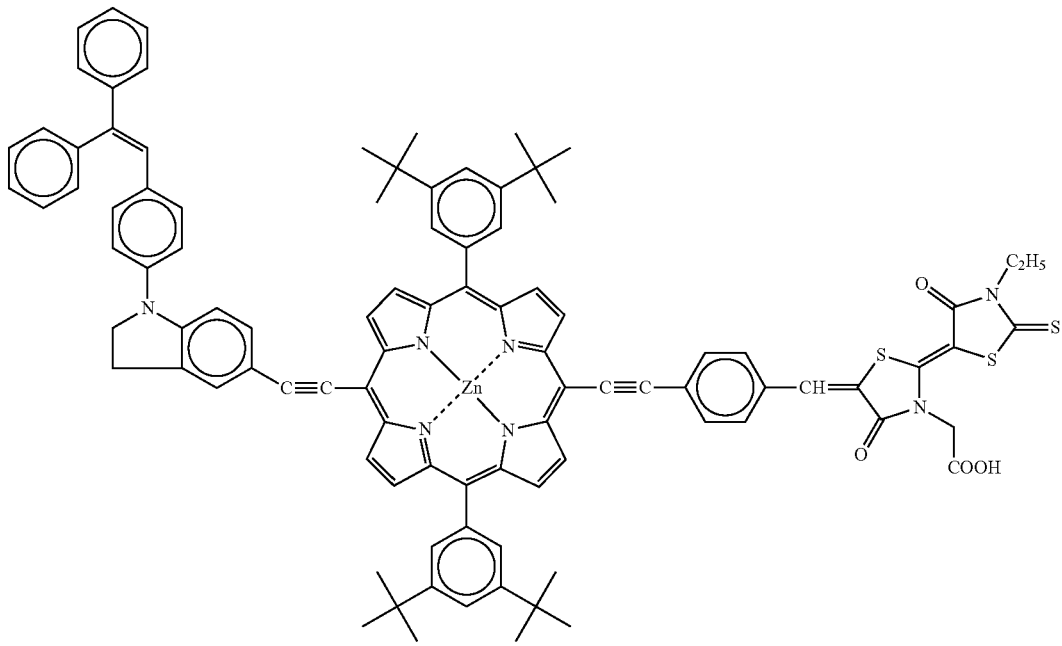

TABLE 1-continued
No. 10
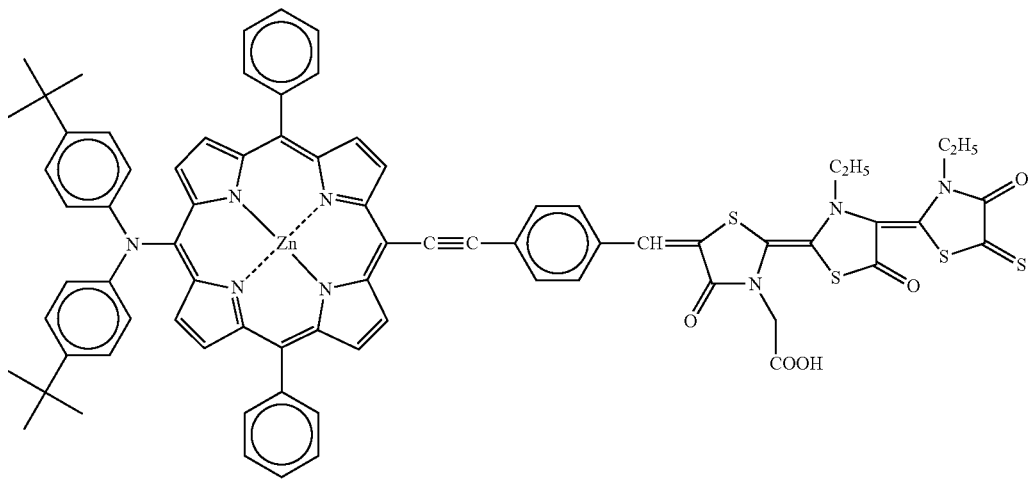
No. 11
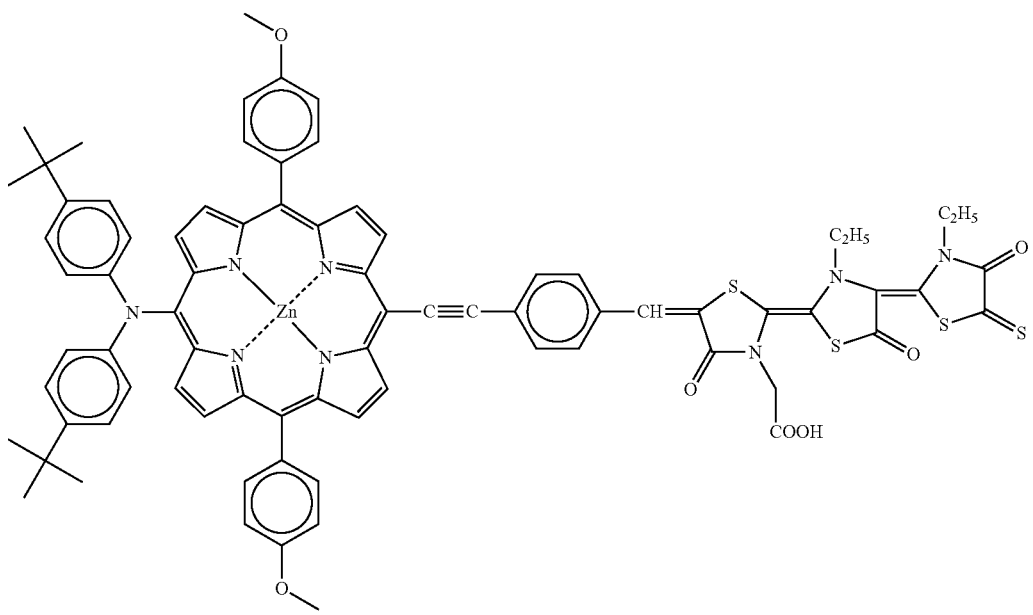
No. 12
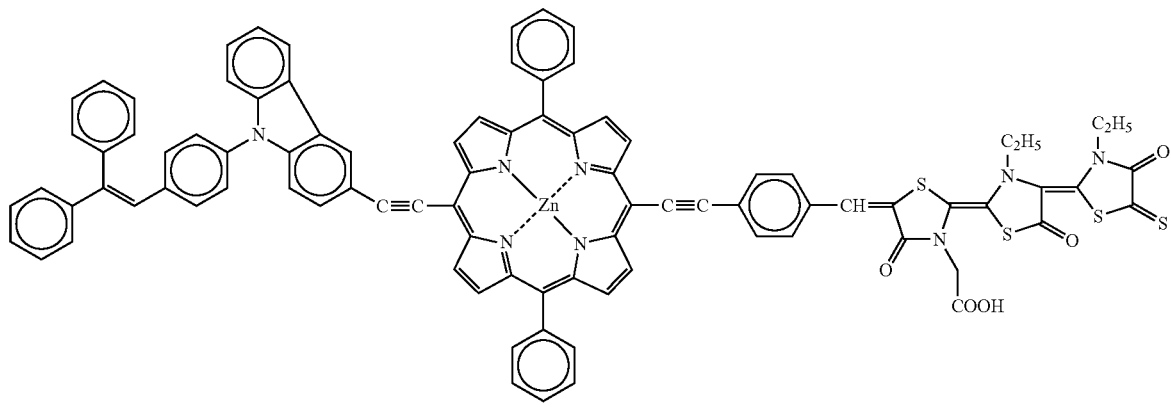

<Other Components>
<<Other Photosensitizing Compound>>

The porphyrin compounds may be used alone or in combination of two or more thereof, or may be used in combination with other photosensitizing compounds.

Examples of the other photosensitizing compounds include: metal complex compounds described in, for example, JP-A Nos. 07-500630, 10-233238, 2000-26487, 2000-323191, and 2001-59062; coumarin compounds described in, for example, JP-A Nos. 10-93118, 2002-164089, and 2004-95450, and J. Phys. Chem. C, 7224, Vol. 111 (2007); polyene compounds described in, for example, JP-A No. 2004-95450 and Chem. Commun., 4887 (2007); indoline compounds described in, for example, JP-A Nos. 2003-264010, 2004-63274, 2004-115636, 2004-200068, and 2004-235052, J. Am. Chem. Soc., 12218, Vol. 126 (2004), and Chem. Commun., 3036 (2003), Angew. Chem. Int. Ed., 1923, Vol. 47 (2008); thiophene compounds described in, for example, J. Am. Chem. Soc., 16701, Vol. 128 (2006) and J. Am. Chem. Soc., 14256, Vol. 128 (2006); cyanine dyes described in, for example, JP-A Nos. 11-86916, 11-214730, 2000-106224, 2001-76773, and 2003-7359; merocyanine dyes described in, for example, JP-A Nos. 11-214731, 11-238905, 2001-52766, 2001-76775, and 2003-7360; 9-arylxanthene compounds described in, for example, JP-A Nos. 10-92477, 11-273754, 11-273755, and 2003-31273; triarylmethane compounds described in, for example, JP-A Nos. 10-93118 and 2003-31273; and phthalocyanine compounds and porphyrin compounds described in, for example, JP-A Nos. 09-199744, 10-233238, 11-204821, and 11-265738, J. Phys. Chem., 2342, Vol. 91 (1987), J. Phys. Chem. B, 6272, Vol. 97 (1993), Electroanal. Chem., 31, Vol. 537 (2002), JP-A No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008).

[Coating Method]

A method for coating the electron transporting material with the porphyrin compound is not particularly limited and may be appropriately selected depending on the intended purpose. Examples thereof include a method of adsorbing the porphyrin compound onto a surface of the electron transporting material.

Examples of the method of adsorbing the porphyrin compound, which is a photosensitizing compound, and optionally-used other photosensitizing compounds onto the electron transporting material include a method in which the electron transporting material (e.g., an electron collecting electrode containing the electron transporting material) is immersed in a solution or dispersion liquid of the photosensitizing compound; and a method in which a solution or dispersion liquid of the photosensitizing compound is coated for adsorption on the electron transporting material (e.g., an electron transporting layer containing the electron transporting material).

In the former method, an immersion method, a dip method, a roller method, an air knife method, and other methods can be used. In the latter method, a wire bar method, a slide hopper method, an extrusion method, a curtain method, a spin method, a spray method, and other methods can be used.

Also, it is preferable to conduct the adsorption of the porphyrin compound on the electron transporting material in a supercritical fluid using, for example, carbon dioxide. The electron transporting material is preferably one coated with the porphyrin compound in a supercritical carbon dioxide fluid.

The supercritical carbon dioxide fluid used in the above coating method is not particularly limited and may be appropriately selected depending on the intended purpose. The pressure of the supercritical carbon dioxide fluid is preferably 15 MPa to 45 MPa from the viewpoint of attaining increased adsorption intensity of the porphyrin compound. The temperature thereof is preferably 35° C. to 60° C. from the viewpoint of attaining increased adsorption efficiency of the porphyrin compound.

The supercritical fluid is not particularly limited and may be appropriately selected depending on the intended purpose so long as it is a fluid that is not condensable even under compression, that exists as a noncondensable high-density fluid at temperature and pressure exceeding the corresponding critical points, which are limiting points at which a gas and a liquid can coexist, and that is in a state equal to or higher than critical pressure and critical temperature. A fluid having a lower critical temperature is preferable.

Suitable examples of the supercritical fluid include carbon monoxide, carbon dioxide, ammonia, nitrogen, water, alcohol solvents such as methanol, ethanol, and n-butanol, hydrocarbon solvents such as ethane, propane, 2,3-dibutylbutane, benzene, and toluene, halogen solvents such as methylene chloride and chlorotrifluoromethane, and ether solvents such as dimethyl ether. Among these, carbon dioxide is particularly preferable since it has a critical pressure of 7.3 MPa and a critical temperature of 31° C. and thus can easily form a supercritical state and allows easy handling because of its incombustibility.

These fluids may be used alone or as a mixture of two or more kinds thereof.

A subcritical fluid may be used. The subcritical fluid is not particularly limited and may be appropriately selected depending on the intended purpose so long as it exists as a high-pressure liquid at temperature and pressure near the corresponding critical points.

The materials exemplified above as the supercritical fluid may suitably be used as the subcritical fluid also.

The critical temperature and the critical pressure of the supercritical fluid are not particularly limited and may be appropriately selected depending on the intended purpose. The critical temperature is preferably $-273°$ C. to 300° C., particularly preferably 0° C. to 200° C.

Also, an organic solvent and an entrainer may be used in combination with the above supercritical fluid and subcritical fluid.

Addition of the organic solvent and the entrainer makes it easier to adjust solubility in the supercritical fluid.

The organic solvent is not particularly limited and may be appropriately selected depending on the intended purpose. Examples thereof include: ketone solvents such as acetone, methyl ethyl ketone, and methyl isobutyl ketone; ester solvents such as ethyl formate, ethyl acetate, and n-butyl acetate; ether solvents such as diisopropyl ether, dimethoxyethane, tetrahydrofuran, dioxolane, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene.

A fusion agent may be used in combination when adsorbing the photosensitizing compound.

The fusing agent may be an agent having such a catalytic action that physically or chemically binds the photosensitizing compound and the electron transporting compound on a surface of an inorganic material, or an agent that stoichiometrically acts to advantageously shift chemical equilibrium.

Moreover, a thiol or hydroxyl compound may be added as a fusion aid.

Examples of the solvent in which the photosensitizing compound is to be dissolved or dispersed include alcohol solvents such as water, methanol, ethanol, and isopropyl alcohol; ketone solvents such as acetone, methyl ethyl ketone, and methyl isobutyl ketone; ester solvents such as ethyl formate, ethyl acetate, and n-butyl acetate; ether solvents such as diethyl ether, dimethoxyethane, tetrahydrofuran, dioxolane, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene. These may be used alone or as a mixture of two or more thereof.

Some kinds of the photosensitizing compound act more effectively when aggregation between the compounds is prevented. Hence, a co-adsorbent (a disaggregating agent) may be used in combination.

Examples of the co-adsorbent preferably used include steroid compounds such as cholic acid and chenodeoxycholic acid, long-chain alkylcaroboxylic acids, and long-chain alkylphosphonic acids. The co-adsorbent is appropriately selected in consideration of the photosensitizing compound (dye) used. An amount of the disaggregating agent added is preferably 0.01 parts by mass to 500 parts by mass, more preferably 0.1 parts by mass to 100 parts by mass, relative to 1 part by mass of the dye.

A temperature at which the photosensitizing compound, or the photosensitizing compound and the co-adsorbent is/are adsorbed is preferably −50° C. to 200° C.

This adsorption may be performed in a state where the materials are left to stand still or are being stirred.

In the case of performing stirring, the stirring is performed with, for example, a stirrer, a ball mill, a paint conditioner, a sand mill, an attritor, a disperser, or ultrasonic dispersion, but an employable method is not limited thereto.

A time for the adsorption is preferably 5 seconds to 1,000 hours, more preferably 10 seconds to 500 hours, still more preferably 1 minute to 150 hours.

Also, the adsorption is preferably performed in the dark.

(Solar Cell)

A solar cell of the present invention is a dye-sensitized solar cell that includes a first electrode, an electron transporting layer on the first electrode, and a second electrode facing the electron transporting layer; and, if necessary, includes other layers such as a charge transfer layer.

The electron transporting layer includes the above-described photoelectric conversion element of the present invention.

Hereinafter, the present invention will be described in detail.

The configuration of the dye-sensitized solar cell will be described with reference to FIG. 1.

Note that, FIG. 1 is a cross-sectional view of one example of the dye-sensitized solar cell.

The dye-sensitized solar cell according to the embodiment illustrated in FIG. 1 includes: a substrate (1); a first electrode (2) on the substrate (1); an electron transporting layer (3) formed of particles of an electron transporting material; a photosensitizer (4) adsorbed on the electron transporting material; a charge transfer layer (5); and a second electrode (6), wherein the electron transporting layer (3) and the charge transfer layer (5) are sandwiched between the first electrode (2) and the second electrode (6).

<First Electrode>

The first electrode (2) is not particularly limited so long as it is formed of an electroconductive material transparent with respect to visible light. It may be a commonly used electrode (negative electrode) or a known electrode used in, for example, a liquid crystal panel.

Examples of the material include indium-tin oxide (hereinafter referred to as ITO), fluorine-doped tin oxides (hereinafter referred to as FTO), antimony-doped tin oxide (hereinafter referred to as ATO), indium-zinc oxides, niobium-titanium oxides, and graphene. These may be used alone or in combination of two or more thereof, or may be laminated.

The thickness of the first electrode is preferably 5 nm to 100 μm, more preferably 50 nm to 10 μm.

Also, in order to keep certain hardness, the first electrode is preferably provided on a substrate formed of a material transparent with respect to visible light. Examples of the substrate used include glass, a transparent plastic plate, a transparent plastic film, and an inorganic transparent crystal.

The first electrode may be a known electroconductive support which is a united structure of the first electrode and the substrate. Examples of the electroconductive support include FTO-coated glass, ITO-coated glass, zinc oxide: aluminum-coated glass, an FTO-coated transparent plastic film, and an ITO-coated transparent plastic film.

Alternatively, the electroconductive support may be a substrate (e.g., a glass substrate) provided thereon with a transparent electrode where tin oxide or indium oxide is doped with cations or anions having different atomic valences, or with a metal electrode formed to have, for example, a mesh-patterned structure or a stripe-patterned structure in order for light to transmit it.

These may be used alone or in combination of two or more thereof, or may be laminated. Also, in order to reduce resistance, a metal lead wire or other members may be used in combination.

Examples of the material of the metal lead wire include metals such as aluminum, copper, silver, gold, platinum, and nickel. A method for producing the first electrode using the metal lead wire is, for example, a method in which the metal lead wire is disposed on the substrate through, for example, vapor deposition, sputtering, or pressure bonding, followed by forming ITO or FTO thereon.

<Electron Transporting Layer>

In the dye-sensitized solar cell of the present invention, a thin film formed of an electron transporting material (a semiconductor) is formed on the first electrode (2) as the electron transporting layer (3).

The electron transporting layer contains the above-described photoelectric conversion element of the present invention and the electron transporting material is coated with the porphyrin compound.

The electron transporting layer (3) may have a laminated structure where a dense electron transporting layer is formed on the first electrode (2) and a porous electron transporting layer is formed on the dense electron transporting layer.

The dense electron transporting layer is formed for preventing electrical contact between the first electrode (2) and the charge transfer layer (5). Therefore, so long as the first electrode (2) and the charge transfer layer (5) are not in physical contact with each other, a pin hole, a crack, or the like may be formed.

The thickness of the dense electron transporting layer is not particularly limited but is preferably 10 nm to 1 μm, more preferably 20 nm to 700 nm.

Note that, the expression "dense" of the dense electron transporting layer means that the electron transporting material in the dense electron transporting layer is present in the form of a thin film at a higher filling density than that of the electron transporting material in the electron transporting layer. A method for forming the dense electron transporting layer in the form of a thin film is, for example, a dry process such as sputtering and a wet process such as spin coating.

The porous electron transporting layer formed on the dense electron transporting layer may be a single layer or a multi layer.

When it is a multi layer, the multi layer may be formed by coating dispersion liquids of electron transporting materials having different particle diameters so as to form multiple layers, or by coating multiple layers having different kinds of electron transporting materials and different compositions such as resin and additives.

Coating multiple layers is an effective means when a single coating cannot provide an enough thickness.

In general, the larger the thickness of the electron transporting layer, the more the amount of the photosensitizing compound carried per the projected unit area thereof. As a result, the rate of capturing light increases, but the distance through which the injected electrons will scatter increases as well to increase loss due to recombination of charges. Therefore, the thickness of the electron transporting layer is preferably 100 nm to 100 μm.

A method for forming the electron transporting layer is not particularly limited, and examples thereof include a method of forming a thin film in vacuum (e.g., sputtering) and a method of forming a film through a wet process.

Considering, for example, the production cost, the method of forming a film through a wet process is particularly preferable. In a specific, preferable method, powder or sol of the electron transporting material is dispersed to prepare a paste containing the powder or sol dispersed therein, and the paste is coated on an electron collecting electrode substrate.

In the case where the method of forming a film through a wet process is used, its coating method is not particularly limited and coating may be performed by a known method.

Examples of the coating method include various methods such as a dip method, a spray method, a wire bar method, a spin coat method, a roller coat method, a blade coat method, a gravure coat method, and wet printing methods (e.g., anastatic printing, offset printing, intaglio printing, rubber plate printing, and screen printing).

When the dispersion liquid is prepared through mechanical milling or using a mill, the dispersion liquid is prepared by dispersing, in water or an organic solvent, at least semiconductor particles alone or a mixture of semiconductor particles and a resin.

Examples of the resin used in the preparation of the dispersion liquid include: polymers and copolymers of vinyl compounds including styrene, vinyl acetate, acrylic acid esters, and methacrylic acid esters; and silicone resins, phenoxy resins, polysulfone resins, polyvinylbutyral resins, polyvinylformal resins, polyester resins, cellulose ester resins, cellulose ether resins, urethane resins, phenol resins, epoxy resins, polycarbonate resins, polyarylate resins, polyamide resins, and polyimide resins.

Examples of the solvent used for dispersing the electron transporting material include water; alcohol solvents such as methanol, ethanol, isopropylalcohol, and α-terpineol; ketone solvents such as acetone, methyl ethyl ketone, and methyl isobutyl ketone; ester solvents such as ethyl formate, ethyl acetate, and n-butyl acetate; ether solvents such as diethyl ether, dimethoxyethane, tetrahydrofuran, dioxolane, and dioxane; amide solvents such as N,N-dimethylformamide, N,N-dimethoxyacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodebenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. These may be used alone or as a solvent mixture of two or more kinds thereof.

In addition, an acid such as hydrochloric acid, nitric acid, or acetic acid; a surfactant such as polyoxyethylene(10) octylphenyl ether; and a chelating agent such as acetylacetone, 2-aminoethanol, or ethylenediamine may be added to the dispersion liquid of the electron transporting material or the paste of the electron transporting material obtained by, for example, a sol-gel method, in order to prevent re-aggregation of the particles.

Furthermore, it is an effective means to add a thickening agent for improving film forming property.

Examples of the thickening agent to be added include polymers such as polyethylene glycol and polyvinyl alcohol and thickening agents such as ethylcellulose.

The electron transporting material after coating is preferably treated through baking, irradiation with microwaves, irradiation with electron beams, or irradiation with laser light, in order to achieve electrical contact between the particles and improve the hardness of the film and adhesiveness to the substrate. These treatments may be performed alone, or combinations of two or more thereof may be performed.

When baking is performed, a temperature range for baking is not particularly limited. However, when the temperature for baking is increased excessively, the substrate may increase in resistance or may melt. Hence, it is preferably 30° C. to 700° C., more preferably 100° C. to 600° C. The time for the baking is not particularly limited either, but is preferably 10 minutes to 10 hours.

In order to increase the surface area of the electron transporting material and the rate of electrons injected from the photosensitizing compound into the electron transporting material, the product obtained after baking may be subjected to, for example, chemical plating using an aqueous solution of titanium tetrachloride or a solvent mixture of an organic solvent and titanium tetrachloride, or electrochemical plating using an aqueous solution of titanium trichloride.

The irradiation with microwaves may be performed by irradiating either the side where the electron transporting layer is formed, or the rear side where the electron transporting layer is not formed.

The time for the irradiation is not particularly limited but is preferably within 1 hour.

A film formed through lamination by, for example, sintering the electron transporting material of nanoparticles several tens nanometers in diameter forms a porous state.

This nano-porous structure has a very large surface area, and its surface area can be expressed by a roughness factor. This roughness factor is a value that expresses an actual area inside the porous structure relative to the area of the electron transporting material coated on the substrate. Therefore, the roughness factor is preferably greater, but considering the relationship with the thickness of the electron transporting layer, it is preferably 20 or greater in the present invention.

The method of coating the photosensitizing compound (4) on the electron transporting layer (3) may be a method described for the coating method in the photoelectric conversion element of the present invention. Examples thereof include a method in which an electron collecting electrode containing the electron transporting material is immersed in a solution or dispersion liquid of the photosensitizing compound; and a method in which a solution or dispersion liquid of the photosensitizing compound is coated on an electron transporting layer containing the electron transporting material for adsorption.

<Charge Transfer Layer>

The charge transfer layer usable is, for example, an electrolytic solution obtained by dissolving a redox pair in an organic solvent, a gel electrolyte obtained by impregnating a polymer matrix with liquid containing a redox pair dissolved in an organic solvent, a molten salt containing a redox pair, a solid electrolyte, an inorganic hole transport material, or an organic hole transport material.

The electrolytic solution is preferably composed of an electrolyte, a solvent, and an additive. Examples of the electrolyte preferable include combinations of iodine and metal iodides such as lithium iodide, sodium iodide, potassium iodide, cesium iodide, and calcium iodide; combinations of iodine and iodine salts of quaternary ammonium compounds such as teraalkylammonium iodide, pyridinium iodide, and imidazolium iodide; combinations of bromine and metal bromides such as lithium bromide, sodium bromide, potassium bromide, cesium bromide, and calcium bromide; combinations of bromine and bromine salts of quaternary ammonium compounds such as teraalkylammonium bromide and pyridinium bromide; metal complexes such as ferrocyanic acid salts-ferricyanic acid salts, and ferrocene-ferricinium ions; sulfur compounds such as polysodium sulfide and alkylthiol-alkyldisulfide; metal complexes such as viologen dyes, hydroquinone-quinone, and cobalt complexes; and nitroxide radical compounds.

The electrolyte may be a single combination or a mixture thereof. Also, when ionic liquid such as imidazolinium iodide is used, a solvent may not be used.

The concentration of the electrolyte in the electrolytic solution is preferably 0.05 M to 20 M, more preferably 0.1 M to 15 M. Examples of the solvent preferably used in the electrolytic solution include carbonate solvents such as ethylene carbonate and propylene carbonate; heterocyclic compounds such as 3-methyl-2-oxazolidinone; ether solvents such as dioxane, diethyl ether, and ethylene glycol dialkyl ether; alcohol solvents such as methanol, ethanol, and polypropylene glycol monoalkyl ether; nitrile solvents such as acetonitrile and benzonitrile; and aprotic polar solvents such as dimethylsulfoxide and sulfolane. Also, a basic compound such as t-butylpyridine, 2-picoline, or 2,6-lutidine may be used in combination.

In the present invention, the electrolyte may also be allowed to undergo gelation by means of, for example, addition of polymers, addition of an oil gelling agent, polymerization of polyfunctional monomers, and crosslinking reaction of polymers.

Examples of the polymers preferably used for the gelation by the addition of polymers include polyacrylonitrile and polyvinylidene fluoride.

Examples of the gelling agents preferably used for the gelation by the addition of an oil gelling agent include dibenzylidene-D-sorbitol, cholesterol derivatives, amino acid derivatives, alkylamide derivatives of trans-(1R,2R)-1, 2-cyclohexanediamine, alkylurea derivatives, N-octyl-D-gluconamide benzoate, two-headed amino acid derivatives, and quaternary ammonium derivatives.

Examples of the monomers preferably used in the polymerization by polyfunctional monomers include divinylbenzene, ethylene glycol dimethacrylate, ethylene glycol diacrylate, diethylene glycol dimethacrylate, triethylene glycol dimethacrylate, pentaerythritol triacrylate, and trimethylolpropane triacrylate. In addition, the following monomers may also be contained, for example: esters and amides derived from acrylic acid and α-alkylacrylic acid (e.g., acrylamide and methyl acrylate); esters derived from maleic acid and fumaric acid (e.g., dimethyl maleate and diethyl fumarate); dienes such as butadiene and cyclopentadiene; aromatic vinyl compounds such as styrene, p-chlorostyrene, and sodium styrene sulfonate; vinyl esters; acrylonitrile; methacrylonitrile; vinyl compounds containing a nitrogen-containing heterocyclic ring; vinyl compounds containing a quaternary ammonium salt; N-vinylformamide; vinylsulfonic acid; vinylidene fluoride; vinylalkyl ethers, and N-phenylmaleimide.

The amount of the polyfunctional monomers in the total amount of the monomers is preferably 0.5% by mass to 70% by mass, more preferably 1.0% by mass to 50% by mass.

The above monomers can be polymerized through radical polymerization. The monomer for the gelated electrolyte usable in the present invention can be radical polymerized with heat, light, or electron beams, or in an electrochemical manner. A polymerization initiator used for forming a cross-linked polymer by heating is preferably an azo initiator such as 2,2'-azobis(isobutyronitrile), 2,2'-azobis(2,4-dimethylvaleronitrile), or dimethyl-2,2'-azobis(2-methylpropionate), or a peroxide initiator such as benzoyl peroxide. An amount of the polymerization initiator added is preferably 0.01% by mass to 20% by mass, more preferably 0.1% by mass to 10% by mass, relative to the total amount of the monomers.

When the electrolyte is gelated by the crosslinking reaction of the polymer, it is desirable to use in combination a crosslinking agent and a polymer containing reactive groups necessary for crosslinking reaction. Examples of preferable crosslinkable reactive groups include nitrogen-containing heterocyclic rings such as pyridine, imidazole, thiazole, oxazole, triazole, morpholine, piperidine, and piperazine. Examples of preferable crosslinking agents include di- or higher functional reagents that can cause electrophilic reaction with respect to a nitrogen atom, such as alkyl halides, aralkyl halides, sulfonic acid esters, acid anhydrides, acid chlorides, and isocyanates.

<<Inorganic Hole Transport Material>>

When an inorganic hole transport material such as an inorganic solid compound is used instead of the electrolyte, copper iodide, copper thiocyanide, or other compounds can be introduced into the electrode by means of, for example, a cast method, a coating method, a spin coat method, an immersion method, or electrolytic plating.

<<Organic Hole Transport Material>>

In the present invention, an organic hole transport material may also be used instead of the electrolyte. A layer structure formed from the organic hole transport material may be a single layer structure formed of a single material, or may be a laminated structure formed of a plurality of compounds.

In the case of the laminated structure, a polymer material is preferably used in an organic hole transport material layer close to the second electrode (6). This is because use of a polymer having superior in film formability can make the surface of the porous electron transporting layer more smooth and improve properties of photoelectric conversion. In addition, since it is difficult for a polymer to penetrate into the porous electron transporting layer, such a polymer advantageously covers the surface of the porous electron transporting layer and prevents short circuit that would otherwise arise when providing electrodes, making it possible to obtain high performances.

The organic hole transport material used in the single layer structure formed of a single material may be a known organic hole transporting material. Specific examples thereof include: oxadiazole compounds described in, for example, Japanese Patent Application Publication (JP-B) No. 34-5466; triphenylmethane compounds described in, for example, JP-B No. 45-555; pyrazoline compounds described in, for example, JP-B No. 52-4188; hydrazone compounds described in, for example, JP-B No. 55-42380; oxadiazole compounds described in, for example, JP-A No. 56-123544; tetraarylbenzidine compounds described in, for example, JP-A No. 54-58445; and stilbene compounds described in, for example, JP-A Nos. 58-65440 and 60-98437.

The polymer material used in the organic hole transport material layer close to the second electrode (6) in the laminated structure is a known hole transporting polymer material. Specific examples thereof include: polythiophene compounds such as poly(3-n-hexylthiophene), poly(3-n-octyloxythiophene), poly(9,9'-dioctyl-fluorene-co-bithiophene), poly(3,3'''-didodecyl-quarterthiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene); polyphenylenevinylene compounds such as poly[2-methoxy-5-(2-ethylhexyloxy)-1,4-phenylenevinylene], poly[2-methoxy-5-(3,7-dimethyloctyloxy)-1,4-phenylenevinylene], poly[(2-methoxy-5-(2-ethylhexyloxy)-1,4-phenylenevinylene)-co-(4,4'-biphenylene-vinylene)]; polyfluorene compounds such as poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylene-fluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)]; polyphenylene compounds such as poly[2,5-dioctyloxy-1,4-phenylene] and poly[2,5-di(2-ethylhexyloxy-1,4-phenylene]; polyarylamine compounds such as poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], poly[4-(2-ethylhexyloxy) phenylimino-1,4-biphenylene]; and polythiadiazole compounds such as poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole). Among these, polythiophene compounds and polyarylamine compounds are particularly preferable considering carrier mobility and ionization potential.

Also, various additives may be added to the above-listed organic hole transporting compounds.

Examples of the additives include: iodine; metal iodides such as lithium iodide, sodium iodide, potassium iodide, cesium iodide, calcium iodide, copper iodide, iron iodide, and silver iodide; quaternary ammonium salts such as tetraalkylammonium iodide and pyridinium iodide; metal bromides such as lithium bromide, sodium bromide, potassium bromide, cesium bromide, and calcium bromide; bromine salts of quaternary ammonium compounds such as tetraalkylammonium bromide and pyridinium bromide; metal chlorides such as copper chloride and silver chloride; metal acetate salts such as copper acetate, silver acetate, and palladium acetate; metal sulfates such as copper sulfate and zinc sulfate; metal complexes such as ferrocyanic acid salts-ferricyanic acid salts, and ferrocene-ferricinium ions; sulfur compounds such as polysodium sulfide and alkyl-thiol-alkyldisulfide; viologen dyes and hydroquinone-quinone; ionic liquid described in Inorg. Chem. 35 (1996) 1168 such as 1,2-dimethyl-3-n-propylimidazolinium iodide, 1-methyl-3-n-hexylimidazolinium iodide, 1,2-dimethyl-3-ethylimidazolium trifluoromethanesulfonic acid salt, 1-methyl-3-butylimidazolium nonafluorobutylsulfonic acid salt, 1-methyl-3-ethylimidazolium bis(trifluoromethyl)sulfonylimide; basic compounds such as pyridine, 4-t-butylpyridine, and benzimidazole; and lithium compounds such as lithiumtrifluorosulfonylimide and lithiumdiisopropylimide.

Furthermore, in order to improve electroconductivity, an oxidizing agent for changing part of the organic hole transporting material to be radical cation may be added. Examples of the oxidizing agent include hexachloroantimonic acid tris(4-bromophenyl)aminium, and silver hexafluoroantimonate, nitrosonium tetrafluoroborate, and silver nitrate. Addition of the oxidizing agent does not have to oxidize all of the organic hole transporting material but do only have to oxidize part of the organic hole transporting material. The added oxidizing agent may be or may not be removed outside of the system.

The organic hole transport layer forms a hole transport layer directly on the electron transporting layer (3) bearing the photosensitizing compound. A method for forming the organic hole transport layer is not particularly limited, and examples thereof include a method of forming a thin film in vacuum such as vacuum vapor deposition, and a method of forming a film through a wet process. Considering, for example, the production cost, the method of forming a film through a wet process is particularly preferable, and a method for performing coating on the electron transporting layer is preferable.

In the case where the method of forming a film through a wet process is used, its coating method is not particularly limited and coating may be performed by a known method. Examples of the coating method include various methods such as a dip method, a spray method, a wire bar method, a spin coat method, a roller coat method, a blade coat method, a gravure coat method, and wet printing methods (e.g., anastatic printing, offset printing, gravure printing, intaglio printing, rubber plate printing, and screen printing). Alternatively, a film may be formed in a supercritical or subcritical fluid.

The supercritical fluid usable is those described in the above coating method.

In the present invention, a pressing step may be performed after providing a layer containing the organic hole transporting material on the first electrode provided with the electron transporting material coated with the photosensitizing compound. This pressing step is believed to improve adhesiveness of the organic hole transporting material on the porous electrode and hence improve efficiency.

A method for the pressing step is not particularly limited, but examples thereof include: a press molding method using a flat plate such as an IR tablet molding machine; and a roll press method using, for example, a roller. The pressure in the pressing step is preferably 10 kgf/cm$^2$ or more, more preferably 30 kgf/cm$^2$ or more. The time in the pressing step is not particularly limited, but is preferably within 1 hour. Moreover, heat may be applied during the pressing.

During the pressing, a releasing material may be held between the press machine and the electrode. Examples of the releasing material include fluororesins such as polytetrafluoroethylene, polychlorotrifluoroethylene, tetrafluoroethylene-hexafluoropropylene copolymers, perfluoroalkoxyfluorine resins, polyvinylidene fluoride, ethylene-tetrafluoroethylene copolymers, ethylene-chlorotrifluoroethylene copolymers, and plolyvinyl fluoride.

After the pressing step but before formation of the counter electrode, a metal oxide is provided between the layer containing the organic hole transporting material and the second electrode. Examples of the metal oxide include molybdenum oxide, tungsten oxide, vanadium oxide, and nickel oxide, with molybdenum oxide being particularly preferable.

A method for providing the metal oxide on the hole transport material is not particularly limited, and examples thereof include a method of forming a thin film in vacuum (e.g., sputtering or vacuum vapor deposition) and a method of forming a film through a wet process.

In a preferable method of the method of forming a film through a wet process, powder or sol of the metal oxide is dispersed to prepare a paste containing the powder or sol dispersed therein, and the paste is coated on the hole transport layer.

In the case where the method of forming a film through a wet process is used, its coating method is not particularly limited and coating may be performed by a known method.

Examples of the coating method include various methods such as a dip method, a spray method, a wire bar method, a spin coat method, a roller coat method, a blade coat method, a gravure coat method, and wet printing methods (e.g., anastatic printing, offset printing, gravure printing, intaglio printing, rubber plate printing, and screen printing). The thickness of the metal oxide is preferably 0.1 nm to 50 nm, more preferably 1 nm to 10 nm.

<Second Electrode>

In the present invention, the charge transfer layer is mainly formed by two different methods that are non-limiting.

In one method, a second electrode (counter electrode) is attached onto the electron transporting layer bearing the photosensitizing compound, and then the charge transfer layer in the form of liquid is allowed to be held in the gap therebetween. In the other method, the charge transfer layer is directly applied onto the electron transporting layer. In the latter case, the second electrode will be provided after the application of the charge transfer layer.

In the former case, a method for holding the charge transfer layer is, for example, a normal-pressure process utilizing a capillary phenomenon resulting from, for example, immersion, or a vacuum process in which the pressure is adjusted to be lower than the normal pressure to thereby substitute a vapor phase with a liquid phase. In the latter case, the second electrode has to be applied to the wet, un-dried charge transfer layer to prevent leakage of liquid at the edge portions thereof. In use of the gelated electrolyte, it may be coated in a wet state and solidified through, for example, polymerization. In this case, the second electrode may be applied after drying and solidification.

Similar to those usable for the application of the electron transporting layer or the photosensitizing compound, examples of a method for applying the electrolyte, a solution of the organic charge transporting material, or the gelated electrolyte besides include an immersion method, a roller method, a dip method, an air knife method, an extrusion method, a slide hopper method, a wire bar method, a spin method, a spray method, a cast method, and various printing methods.

Similar to the above-described electroconductive support, the second electrode can generally use a support having an electroconductive layer. However, a support is not necessarily needed in such a configuration that strength and sealing property are sufficiently maintained.

Specific examples of materials for the second electrode include metals such as platinum, gold, silver, copper, aluminum, rhodium, and indium; carbon; and electroconductive metal oxides such as ITO and FTO.

The thickness of the second electrode is not particularly limited and may be appropriately selected depending on the intended purpose.

When an inorganic hole transporting material or an organic hole transporting material is used in the charge transfer layer, a hole collecting electrode serving as the second electrode is applied after formation of a solid hole transport layer or on the above-described metal oxide. The hole collecting electrode used may be generally a similar one to the above-described electron collecting electrode serving as the first electrode. The hole collecting electrode is not necessarily needed in such a configuration that strength and sealing property are sufficiently maintained. Specific examples of materials for the hole collecting electrode include: metals such as platinum, gold, silver, copper, and aluminum; carbon compounds such as graphite, fullerene, and carbon nanotube; electroconductive metal oxides such as ITO and FTO; and electroconductive polymers such as polythiophene and polyaniline.

The thickness of the hole collecting electrode layer is not particularly limited, and the materials for the hole collecting electrode may be used alone or a mixture of two or more kinds thereof. The hole collecting electrode can appropriately be formed on the hole transport layer by means of, for example, coating, laminating, vapor deposition, CVD, or attachment, depending on the kind of materials to be used or the kind of the hole transport layer.

In order to perform operations as a photoelectric conversion element, at least one of the first electrode and the second electrode has to be substantially transparent.

In the photoelectric conversion element of the present invention, the first electrode is transparent, and preferably sunlight is allowed to enter the first electrode. In this case, a material reflecting light is preferably used at the side of the second electrode, and the material is preferably glass or plastic on which metal or electroconductive oxide has been vapor deposited, or a metal thin film.

Also, it is an effective means to provide an anti-reflection layer at the side where sunlight enters.

<Applications>

The photoelectric conversion element of the present invention can be applied in a solar cell and a power supply device using a solar cell.

Examples in which the photoelectric conversion element is to be applied may be any device utilizing a conventional solar cell or a power supply device using the same.

The photoelectric conversion element may be used in, for example, an electronic desk calculator or a solar cell for wristwatch. Examples in which the feature of the dye-sensitized solar cell of the present invention is made the most of are power supply devices such as cellular phones, electronic notebooks, and electronic paper. The photoelectric conversion element can also be used as an auxiliary power supply for extending continuous service life of rechargeable or battery-operated electrical apparatus.

EXAMPLES

The present invention will next be described in more detail by way of Examples. These Examples are for making understanding of the present invention easier but not for limiting the present invention. In each example, "part(s)" and "%" means "part(s) by mass" and "% by mass" respectively, unless otherwise specified.

Synthesis Example 1

Synthesis of Exemplary Compound 1

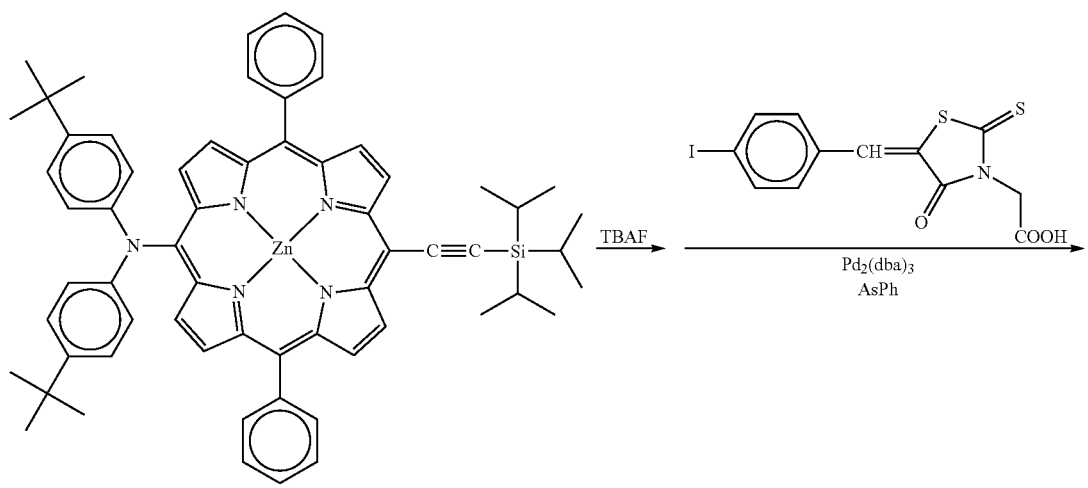

Porphyrin intermediate compound 1

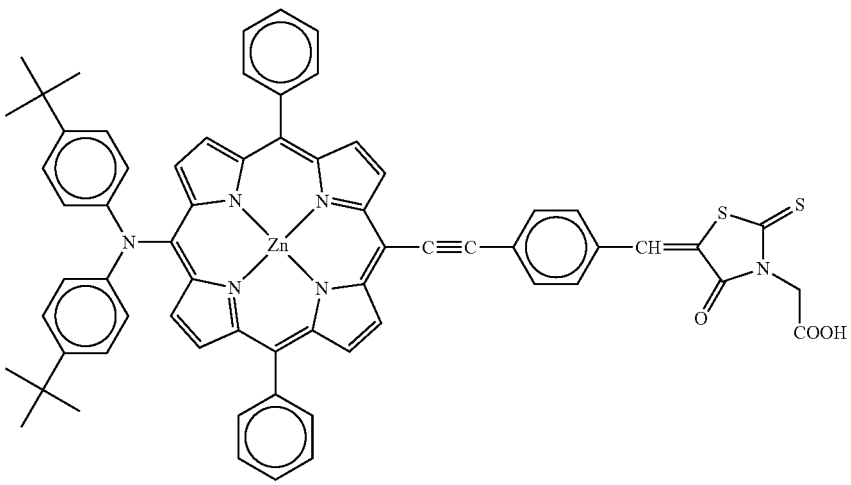

Exemplary Compound 1

A porphyrin intermediate compound 1 (a triisopropylsilyl group-substituted compound; hereinafter abbreviated as "TIPS compound") (9.8 mg, 0.01 mmol) was dissolved in anhydrous THF (5 mL), and the solution was stirred at room temperature in an argon gas atmosphere. Subsequently, 40 μL of Tetrabutylammonium Fluoride (1 mol/L in THF) (product of Tokyo Chemical Industry Co., Ltd.) was added dropwise to the solution, followed by reaction for 1 hour. The reaction mixture was extracted, and the organic phase was dehydrated with magnesium sulfate, filtrated, and concentrated, to thereby obtain a precursor.

Figure 2:
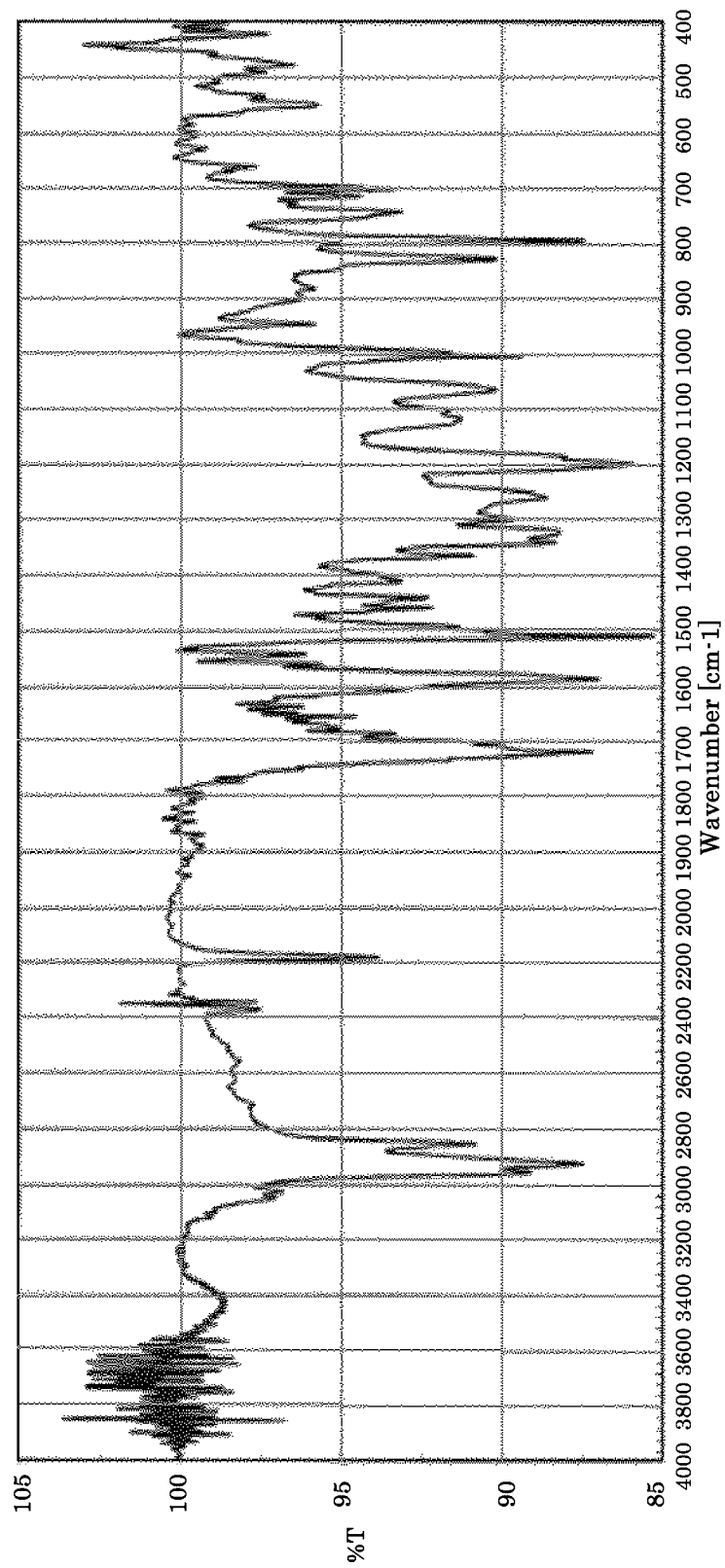
FIG. 2 is an infrared absorption spectral chart of exemplary compound 1 of Synthesis Example 1 in Examples.

Next, the obtained precursor and a rhodanine intermediate (8.1 mg, 0.02 mmol) were dissolved in a solvent mixture of anhydrous THF (5 mL) and triethylamine (1 mL), and the solution was stirred for 10 minutes at room temperature in an argon gas atmosphere. Then, Tris(dibenzylideneacetone)dipalladium(0) (2.3 mg, 0.0025 mmol) (product of Aldrich Corporation) and Triphenylarisine (6.1 mg, 0.02 mmol) (product of Tokyo Chemical Industry Co., Ltd.) were added to the solution, followed by stirring for 3 hours under reflux. The resultant mixture was extracted, and the organic phase was dehydrated with magnesium sulfate, filtrated, concentrated, and purified with a silica gel column (dichloromethane/methanol=20/1 by volume) to thereby obtain an exemplary compound 1 (6 mg) of interest. The infrared absorption spectrum of the obtained exemplary compound 1 is shown in FIG. 2.

Note that, the above porphyrin intermediate compound (TIPS compound) used in the synthesis method in the present invention can be synthesized according to a synthesis method described in J. Phys. Chem., 113, 20990 (2009). In this case, for example, 5,15-Diphenylporphyrin serving as a starting material can be obtained and synthesized according to a method described in J. Org. Chem. 1993, 58, 5983-5993, and 5-Bromo-10,20-diphenylporphyrin and 5-Bromo-10,20-diphenylporphyrin (Zn) can be synthesized according to a method disclosed in J. Org. Chem. 2000, 65, 1650-1664.

The TIPS compound can also be synthesized according to a method described in J. Am. Chem. Soc. 2005, 124, 9710-9720. The same applies to the other photosensitizing compounds.

Furthermore, the above-described conversion to a dye (conversion to a photosensitizing compound) can be performed with reference to a method described in J. Phys. Chem. 113, 20990 (2009).

Synthesis Example 2

Synthesis of Exemplary Compound 7

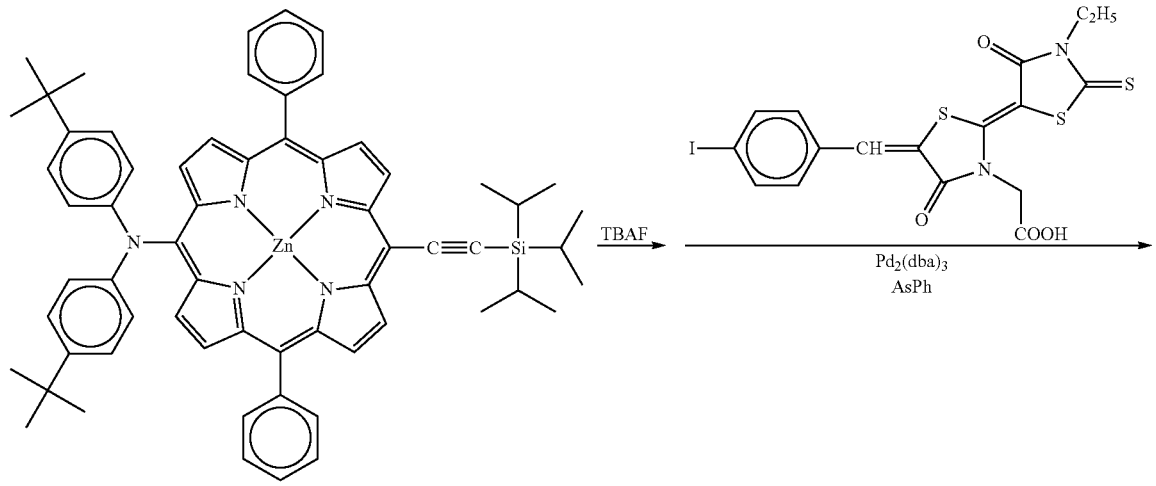

Porphyrin intermediate compound 7

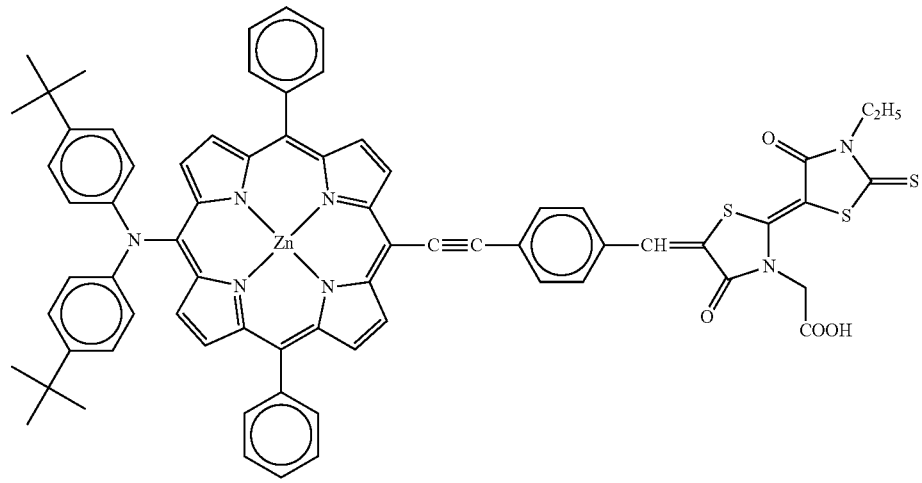

Exemplary Compound 7

A porphyrin intermediate compound 7 (49.3 mg, 0.05 mmol) was dissolved in anhydrous THF (25 mL), and the solution was stirred at room temperature in an argon gas atmosphere. Subsequently, 200 μL of Tetrabutylammonium Fluoride (1 mol/L in THF) (product of Tokyo Chemical Industry Co., Ltd.) was added dropwise to the solution, followed by reaction for 1 hour. The reaction mixture was extracted, and the organic phase was dehydrated with magnesium sulfate, filtrated, and concentrated, to thereby obtain a precursor.

Figure 3:
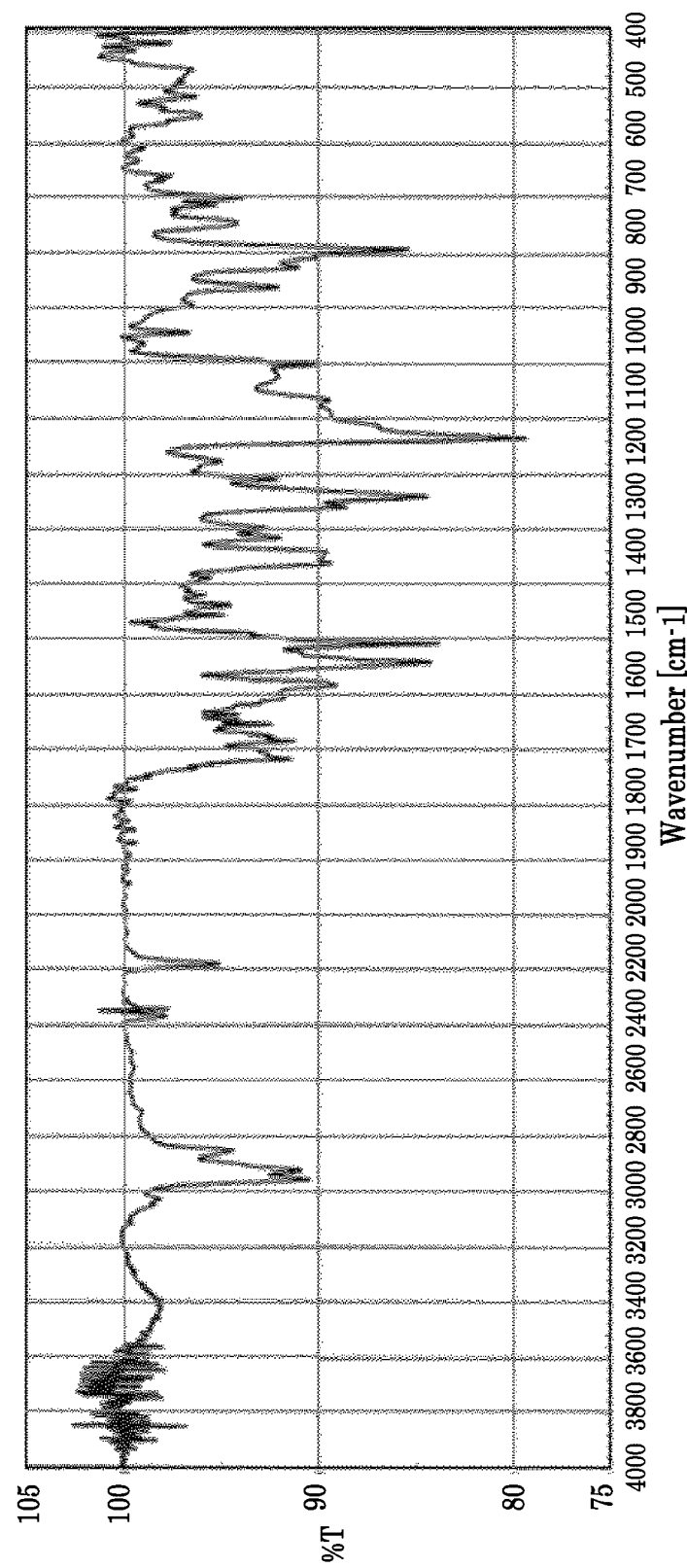
FIG. 3 is an infrared absorption spectral chart of exemplary compound 7 of Synthesis Example 2 in Examples.

Next, the obtained precursor and a rhodanine intermediate (53.24 mg, 0.1 mmol) were dissolved in a solvent mixture of anhydrous THF (25 mL) and triethylamine (5 mL), and the solution was stirred for 10 minutes at room temperature in an argon gas atmosphere. Then, Tris(dibenzylideneacetone)dipalladium(0) (11.5 mg, 0.0125 mmol) (product of Aldrich Corporation) and Triphenylarisine (30.6 mg, 0.1 mmol) (product of Tokyo Chemical Industry Co., Ltd.) were added to the solution, followed by stirring for 3 hours under reflux. The resultant mixture was extracted, and the organic phase was dehydrated with magnesium sulfate, filtrated, concentrated, and purified with a silica gel column (dichloromethane/methanol=20/1 by volume) to thereby obtain an exemplary compound 7 (66 mg) of interest. The infrared absorption spectrum of the obtained exemplary compound 7 is shown in FIG. 3.

Synthesis Example 3

Synthesis of Exemplary Compound 8

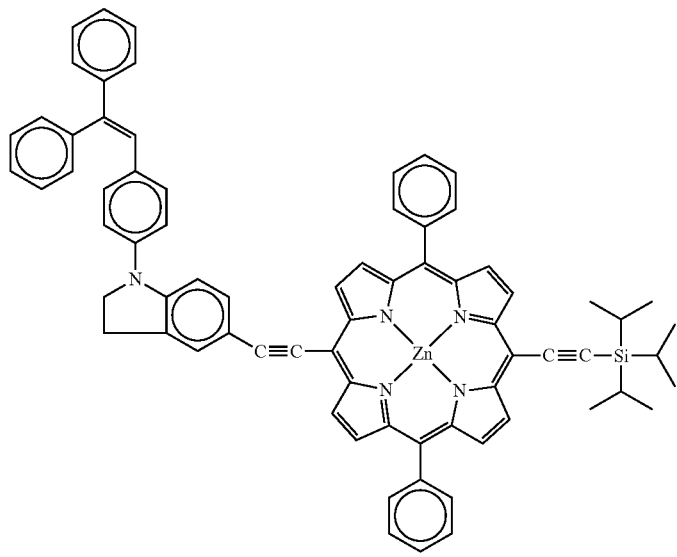
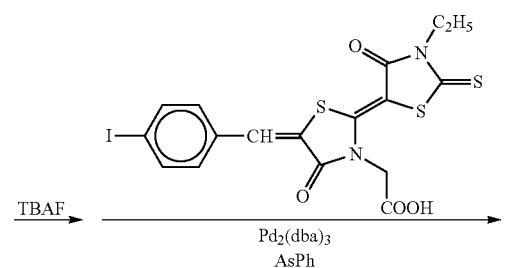

Porphyrin intermediate compound 8

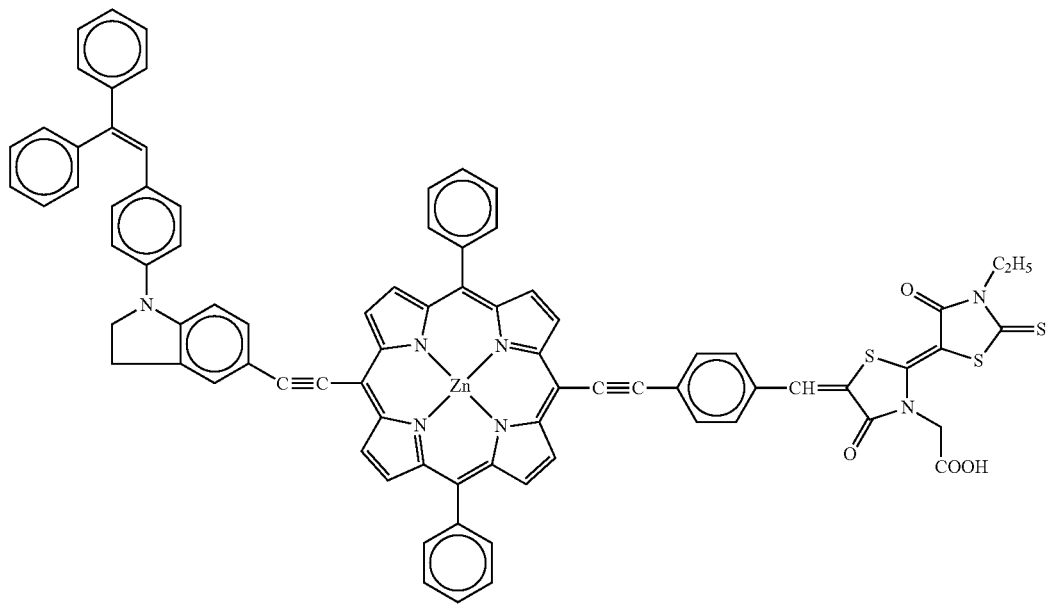

Exemplary Compound 8

A porphyrin intermediate compound 8 (50 mg, 0.045 mmol) was dissolved in anhydrous THF (25 mL), and the solution was stirred at room temperature in an argon gas atmosphere. Subsequently, 180 μL of Tetrabutylammonium Fluoride (1 mol/L in THF) (product of Tokyo Chemical Industry Co., Ltd.) was added dropwise to the solution, followed by reaction for 1 hour. The reaction mixture was extracted, and the organic phase was dehydrated with magnesium sulfate, filtrated, and concentrated, to thereby obtain a precursor.

Figure 4:
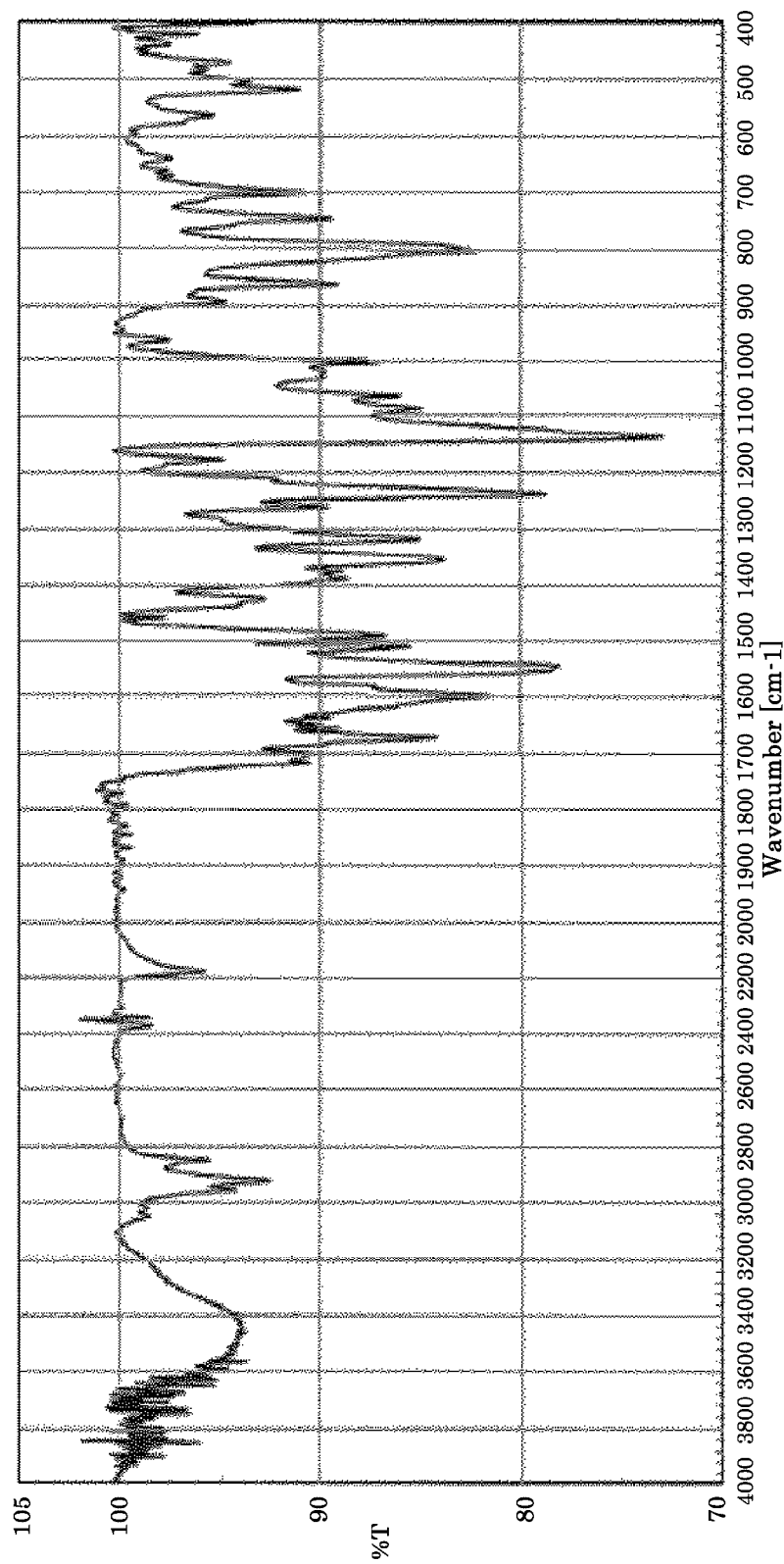
FIG. 4 is an infrared absorption spectral chart of exemplary compound 8 of Synthesis Example 3 in Examples.

Next, the obtained precursor and a rhodanine intermediate (48 mg, 0.09 mmol) were dissolved in a solvent mixture of anhydrous THF (25 mL) and triethylamine (5 mL), and the solution was stirred for 10 minutes at room temperature in an argon gas atmosphere. Then, Tris(dibenzylideneacetone)dipalladium(0) (10.3 mg, 0.01125 mmol) (product of Aldrich Corporation) and Triphenylarisine (27.6 mg, 0.09 mmol) (product of Tokyo Chemical Industry Co., Ltd.) were added to the solution, followed by stirring for 3 hours under reflux. The resultant mixture was extracted, and the organic phase was dehydrated with magnesium sulfate, filtrated, concentrated, and purified with a silica gel column (dichloromethane/methanol=20/1 by volume) to thereby obtain an exemplary compound 8 (19 mg) of interest. The infrared absorption spectrum of the obtained exemplary compound 8 is shown in FIG. 4.

Synthesis Example 4

Synthesis of Exemplary Compound 10

A porphyrin intermediate compound 10 (49.3 mg, 0.05 mmol) was dissolved in anhydrous THF (25 mL), and the solution was stirred at room temperature in an argon gas atmosphere. Subsequently, 200 μL of Tetrabutylammonium Fluoride (1 mol/L in THF) (product of Tokyo Chemical Industry Co., Ltd.) was added dropwise to the solution, followed by reaction for 1 hour. The reaction mixture was extracted, and the organic phase was dehydrated with magnesium sulfate, filtrated, and concentrated, to thereby obtain a precursor.

Figure 5:
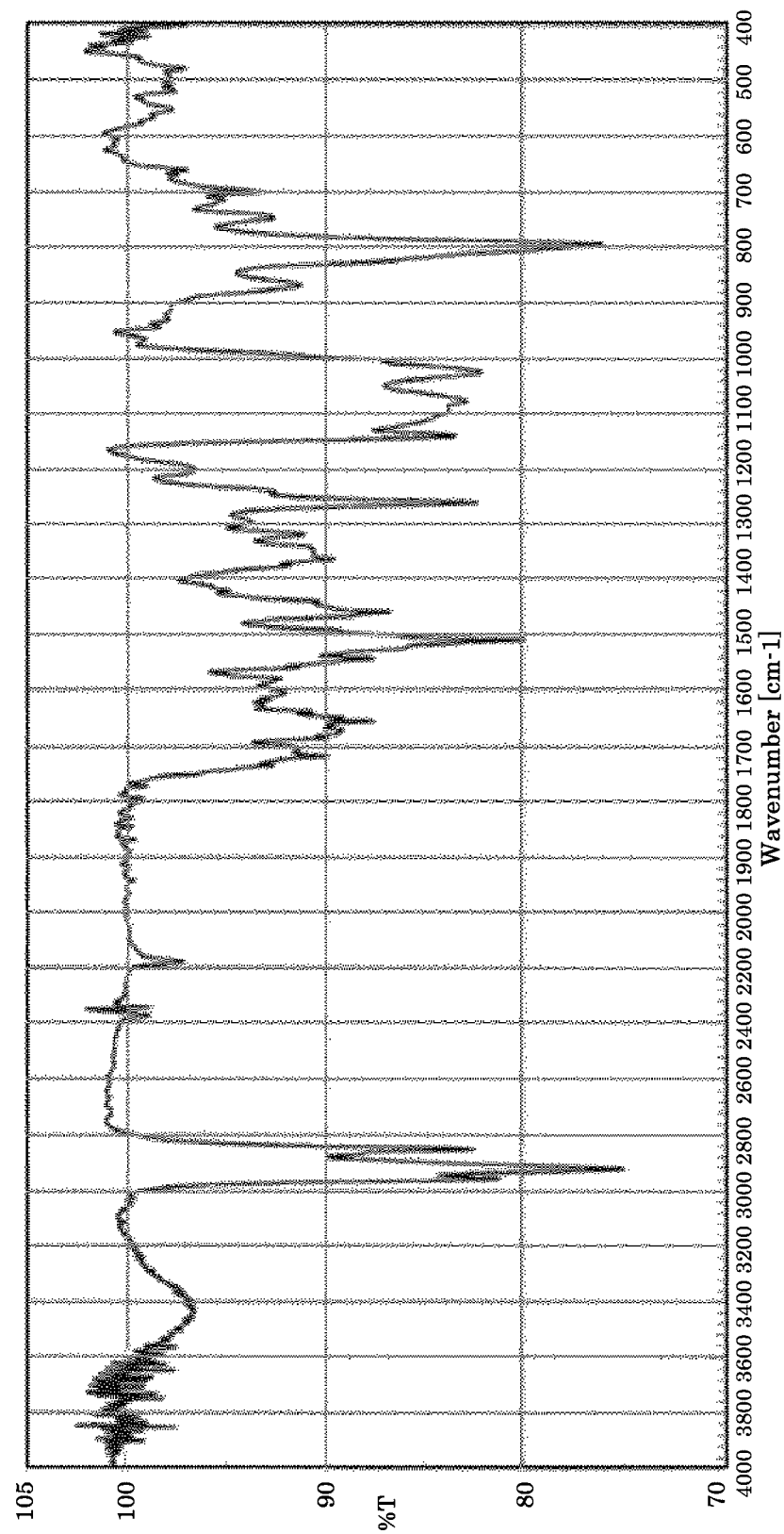
FIG. 5 is an infrared absorption spectral chart of exemplary compound 10 of Synthesis Example 4 in Examples.

Next, the obtained precursor and a rhodanine intermediate (68.7 mg, 0.1 mmol) were dissolved in a solvent mixture of anhydrous THF (25 mL) and triethylamine (5 mL), and the solution was stirred for 10 minutes at room temperature in an argon gas atmosphere. Then, Tris(dibenzylideneacetone)dipalladium(0) (11.5 mg, 0.0125 mmol) (product of Aldrich Corporation) and Triphenylarisine (30.6 mg, 0.1 mmol) (product of Tokyo Chemical Industry Co., Ltd.) were added to the solution, followed by stirring for 3 hours under reflux. The resultant mixture was extracted, and the organic phase was dehydrated with magnesium sulfate, filtrated, concentrated, and purified with a silica gel column (dichloromethane/methanol=20/1 by volume) to thereby obtain an exemplary compound 10 (19 mg) of interest. The infrared absorption spectrum of the obtained exemplary compound 10 is shown in FIG. 5.

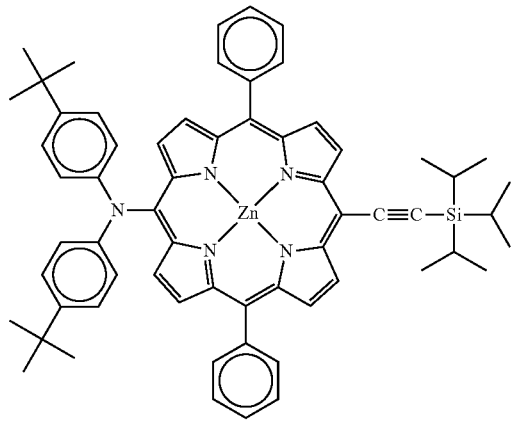
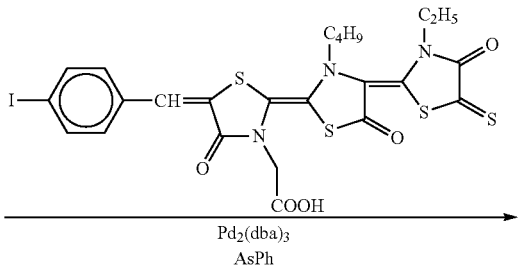

Porphyrin intermediate compound 10

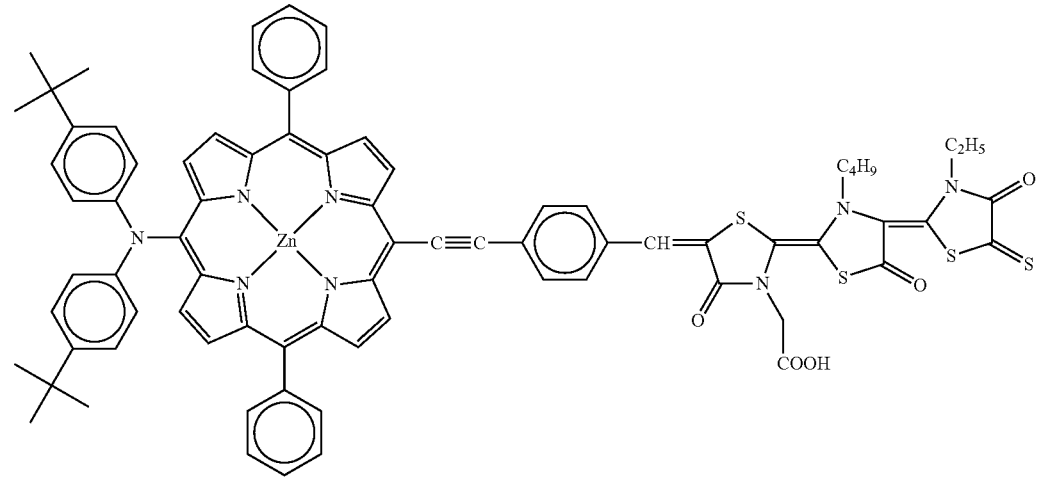

Exemplary Compound 10

Example 1

(Formation of Titanium Oxide Semiconductor Electrode)

Titanium tetra-n-propoxide (2 mL), acetic acid (4 mL), ion-exchange water (1 mL), and 2-propanol (40 mL) were mixed together, and the mixture was spin-coated on an FTO glass substrate, which was dried at room temperature and baked in air at 450° C. for 30 minutes, to thereby form a first electrode. The same solution was used again and spin-coated on the obtained first electrode so as to have a thickness of 100 nm, followed by baking in air at 450° C. for 30 minutes, to thereby form a dense electron transporting layer.

Titanium oxide (P-25, product of Japan Aerosil, Co.) (3 g) and acetylacetone (0.3 g) were treated in a bead mill together with water (5.5 g) and ethanol (1.2 g) for 12 hours.

A surfactant (polyoxyethylene octylphenyl ether, product of Wako Pure Chemical Industries, Ltd.) (0.3 g) and polyethylene glycol (#20,000) (1.2 g) were added to the obtained dispersion liquid, to thereby prepare a paste.

This paste was coated on the above-formed dense electron transporting layer so as to have a thickness of 10 µm, followed by drying at room temperature and then baking in air at 500° C. for 30 minutes, to thereby form a porous electron transporting layer.

The above-formed titanium oxide semiconductor electrode was left to stand still in the dark for 15 hours at room temperature in a tetrahydrofuran solution containing a photosensitizing compound of the exemplary compound 1 at an adjusted concentration of 0.2 mM, whereby the photosensitizing compound was adsorbed thereon.

(Production and Evaluation of Dye-Sensitized Solar Cell)

An electrolytic solution used was a solution of iodine (0.05 M), lithium iodide (0.1 M), and 1,3-dimethyl-2-imidazolinium iodide (0.6 M) dissolved in a mixture of acetonitrile/valeronitrile (=17/3 by volume). A counter electrode (a second electrode) used was an electrode formed by sputtering platinum on FTO. A spacer having a thickness of 30 µm was held between both the electrodes, and the electrolytic solution was injected to produce a dye-sensitized solar cell. Then, the working electrode (first electrode) of the dye-sensitized solar cell was irradiated with artificial sunlight which was generated from a solar simulator (AM1.5, 100 mW/cm$^2$) to thereby evaluate solar cell performances. As a result, the dye-sensitized solar cell showed good values; i.e., an open voltage of 0.52 V, a short-circuit current density of 14.7 mA/cm$^2$, a shape factor of 0.61, and a conversion efficiency of 4.66%.

Example 2

A solar cell was produced and evaluated in the same manner as in Example 1 except that the exemplary compound 1 was changed to exemplary compound 2 shown in Table 1. The results are shown in Table 2, showing good values.

Example 3

A solar cell was produced and evaluated in the same manner as in Example 1 except that the exemplary compound 1 was changed to exemplary compound 3 shown in Table 1. The results are shown in Table 2, showing good values.

Example 4

A solar cell was produced and evaluated in the same manner as in Example 1 except that the exemplary compound 1 was changed to exemplary compound 4 shown in Table 1. The results are shown in Table 2, showing good values.

Example 5

A solar cell was produced and evaluated in the same manner as in Example 1 except that the exemplary compound 1 was changed to exemplary compound 5 shown in Table 1. The results are shown in Table 2, showing good values.

Example 6

A solar cell was produced and evaluated in the same manner as in Example 1 except that the exemplary compound 1 was changed to exemplary compound 6 shown in Table 1. The results are shown in Table 2, showing good values.

Example 7

A solar cell was produced and evaluated in the same manner as in Example 1 except that the exemplary compound 1 was changed to exemplary compound 7 shown in Table 1. The results are shown in Table 2, showing good values.

Example 8

A solar cell was produced and evaluated in the same manner as in Example 1 except that the exemplary compound 1 was changed to exemplary compound 8 shown in Table 1. The results are shown in Table 2, showing good values.

Example 9

A solar cell was produced and evaluated in the same manner as in Example 1 except that the exemplary compound 1 was changed to exemplary compound 9 shown in Table 1. The results are shown in Table 2, showing good values.

Example 10

A solar cell was produced and evaluated in the same manner as in Example 1 except that the exemplary compound 1 was changed to exemplary compound 10 shown in Table 1. The results are shown in Table 2, showing good values.

Example 11

A solar cell was produced and evaluated in the same manner as in Example 1 except that the exemplary compound 1 was changed to exemplary compound 11 shown in Table 1. The results are shown in Table 2, showing good values.

Example 12

A solar cell was produced and evaluated in the same manner as in Example 1 except that the exemplary compound 1 contained at an adjusted concentration of 0.2 mM was changed to a mixed solution containing the exemplary compound 3 at an adjusted concentration of 0.2 mM and chenodeoxycholic acid at an adjusted concentration of 1.0 mM. As a result, the solar cell showed good values; i.e., an open voltage of 0.55 V, a short-circuit current density of 14.8 mA/cm², a shape factor of 0.61, and a conversion efficiency of 4.97%.

Comparative Example 1

A dye-sensitized solar cell was produced and evaluated in the same manner as in Example 1 except that the photosensitizing compound of the exemplary compound 1 contained at an adjusted concentration of 0.2 mM was changed to comparative compound 1. As a result, the dye-sensitized solar cell showed the following values; i.e., an open voltage of 0.51 V, a short-circuit current density of 12.3 mA/cm², a shape factor of 0.61, and a conversion efficiency of 3.83% which is lower than that in the photosensitizing compound of the present invention.

Comparative Compound 8

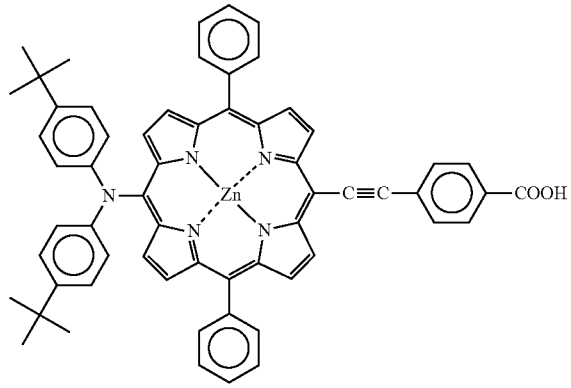

TABLE 2

| Example No. | Exemplary Compound | Open voltage (V) | Short-circuit current density (mA/cm²) | Shape factor | Conversion efficiency (%) |
|---|---|---|---|---|---|
| 1 | No. 1 | 0.52 | 14.7 | 0.61 | 4.66 |
| 2 | No. 2 | 0.53 | 14.9 | 0.63 | 4.98 |
| 3 | No. 3 | 0.54 | 16.3 | 0.62 | 5.46 |
| 4 | No. 4 | 0.52 | 15.8 | 0.61 | 5.01 |
| 5 | No. 5 | 0.59 | 14.9 | 0.59 | 5.19 |
| 6 | No. 6 | 0.61 | 14.8 | 0.6 | 5.42 |
| 7 | No. 7 | 0.51 | 15.5 | 0.61 | 4.82 |
| 8 | No. 8 | 0.53 | 16.9 | 0.63 | 5.64 |
| 9 | No. 9 | 0.54 | 16.8 | 0.62 | 5.62 |
| 10 | No. 10 | 0.55 | 17.4 | 0.59 | 5.24 |
| 11 | No. 11 | 0.61 | 15.9 | 0.51 | 4.95 |
| 12 | No. 3 | 0.55 | 14.8 | 0.61 | 4.97 |
| Comparative Example 1 | Comparative Compound 8 | 0.51 | 12.3 | 0.61 | 3.83 |

As is clear from the results, it is found that the photosensitizing compounds of the present invention have good conversion efficiency and high durability.

(Absorption Spectrum)

Figure 6:
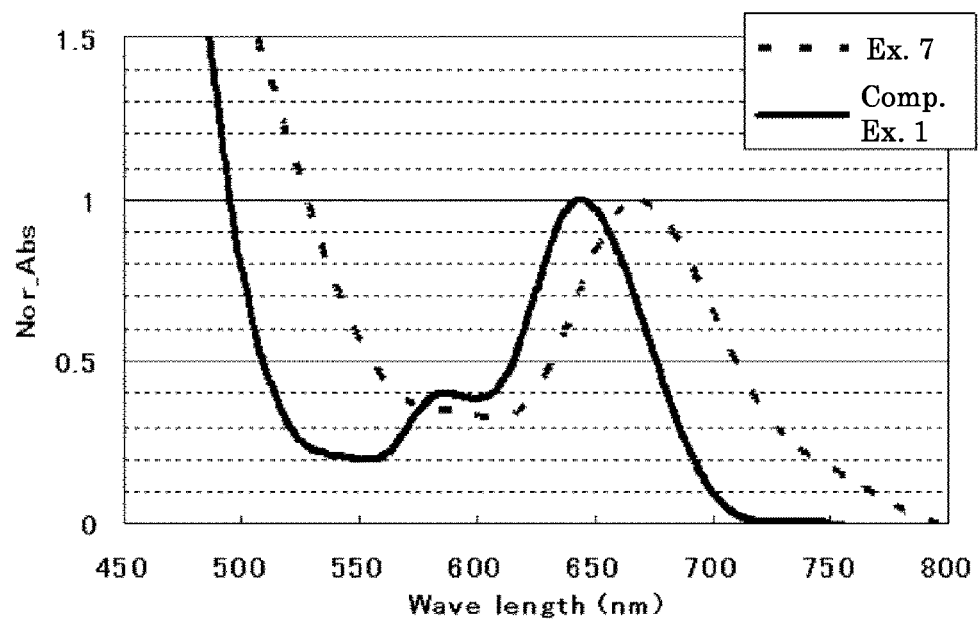
FIG. 6 is a chart showing absorption spectra of exemplary compound 7 of Example 7 and comparative compound 8 of Comparative Example 1.

Titanium oxide semiconductor electrodes were formed in the same manner as in Example 1 except that the thickness of the titanium oxide semiconductor electrode was adjusted to 1 μm and the exemplary compound 7 in Example 7 or the comparative compound 8 in Comparative Example 1 was adsorbed thereon. Absorption spectra of the titanium oxide semiconductor electrodes were measured with UV3100 (product of Hitachi, Ltd.) and shown in FIG. 6.

The absorption spectrum of the titanium oxide semiconductor electrode on which the exemplary compound 7 used in Example 7 had been adsorbed was longer in wavelength than that on which the comparative compound 8 used in Comparative Example 1 had been adsorbed.

Example 13

A solar cell was produced and evaluated in the same manner as in Example 1 except that the photosensitizing compound of the exemplary compound 1 was adsorbed onto the titanium oxide semiconductor electrode in the following manner: a tetrahydrofuran solution containing the photosensitizing compound of the exemplary compound 1 at an adjusted concentration of 0.2 mM and a supercritical fluid dye adsorption system (SCF-220, product of ISCO Co.) were used to leave the titanium oxide semiconductor electrode under supercritical carbon dioxide of 50° C. and 30 MPa for 20 minutes. The results are shown in Table 3.

Examples 14 to 24

Solar cells were produced and evaluated in the same manner as in Example 13 except that the temperature, pressure, and time under supercritical carbon dioxide were changed. The results are shown in Table 3. Each of the solar cells showed good values.

TABLE 3

| Example No. | Exemplary Compound | Temperature (° C.) | Pressure (MPa) | Time (min) | Open voltage (V) | Short-circuit current density (mA/cm²) | Shape factor | Conversion efficiency (%) |
|---|---|---|---|---|---|---|---|---|
| 13 | No. 1 | 50 | 30 | 20 | 0.58 | 16.2 | 0.62 | 5.83 |
| 14 | No. 1 | 50 | 15 | 20 | 0.51 | 14.5 | 0.61 | 4.51 |
| 15 | No. 1 | 50 | 20 | 20 | 0.53 | 15.1 | 0.62 | 4.96 |
| 16 | No. 1 | 50 | 25 | 20 | 0.55 | 15.8 | 0.63 | 5.47 |
| 17 | No. 1 | 50 | 35 | 20 | 0.57 | 15.9 | 0.62 | 5.62 |
| 18 | No. 1 | 50 | 40 | 20 | 0.55 | 15.2 | 0.60 | 5.02 |
| 19 | No. 1 | 50 | 45 | 20 | 0.54 | 14.9 | 0.57 | 4.59 |
| 20 | No. 1 | 35 | 30 | 20 | 0.51 | 14.7 | 0.62 | 4.65 |
| 21 | No. 1 | 40 | 30 | 20 | 0.53 | 15.2 | 0.62 | 4.99 |
| 22 | No. 1 | 45 | 30 | 20 | 0.59 | 15.9 | 0.64 | 6.00 |
| 23 | No. 1 | 55 | 30 | 20 | 0.56 | 15.2 | 0.60 | 5.11 |
| 24 | No. 1 | 60 | 30 | 20 | 0.52 | 14.7 | 0.60 | 4.59 |

Examples 25 to 28

Solar cells were produced and evaluated in the same manner as in Example 13 except that the temperature, pressure, and time under supercritical carbon dioxide were changed. The results are shown in Table 4.

TABLE 4

| Comparative Example No. | Exemplary Compound | Temperature (°C.) | Pressure (MPa) | Time (min) | Open voltage (V) | Short-circuit current density (mA/cm$^2$) | Shape factor | Conversion efficiency (%) |
|---|---|---|---|---|---|---|---|---|
| 25 | No. 1 | 30 | 30 | 20 | 0.47 | 13.8 | 0.57 | 3.70 |
| 26 | No. 1 | 65 | 30 | 20 | 0.49 | 13.9 | 0.56 | 3.81 |
| 27 | No. 1 | 50 | 10 | 20 | 0.50 | 13.7 | 0.58 | 3.97 |
| 28 | No. 1 | 50 | 50 | 20 | 0.51 | 13.9 | 0.55 | 3.90 |

Examples 25 to 28, in which the photosensitizing compound was adsorbed using supercritical carbon dioxide, improved in short-circuit current density by virtue of the increased amount of the adsorbed photosensitizing compound, as compared with Comparative Example 1 in which the photosensitizing compound was adsorbed under atmospheric pressure. However, Examples 25 to 28 decreased in open voltage due to degradation or peeling of the titanium oxide layer, as compared with Examples 13 to 24 in which the photosensitizing compound was adsorbed using supercritical carbon dioxide under suitable conditions. Regarding the generated electrical power, Comparative Examples 1 to 5 showed comparable properties.

Embodiments of the present invention are as follows, for example.

<1> A photoelectric conversion element, including:
an electron transporting material; and
a porphyrin compound represented by the following General Formula (1) or the following General Formula (2),
wherein the electron transporting material is coated with the porphyrin compound:

General Formula (1)

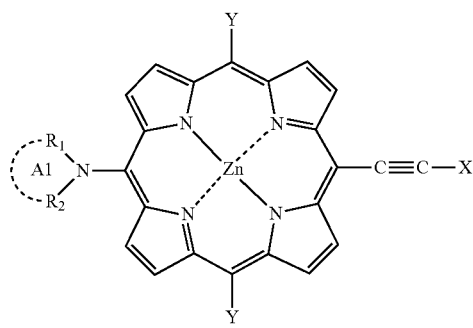

where in General Formula (1), $R_1$ and $R_2$ each independently denote an aromatic hydrocarbon group which has 6 to 20 carbon atoms and may have an alkyl group or an alkoxy group as a substituent, $R_1$ and $R_2$ may be bonded together to form a ring structure denoted by A1, X denotes a monovalent group expressed by the following Structural Formula (I), (II) or (III), and Y denotes a phenyl group which may have an alkyl group or an alkoxy group as a substituent, General Formula (2)

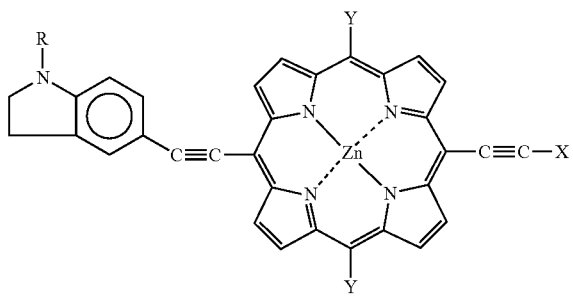

where in General Formula (2), R denotes an aromatic hydrocarbon group which has 6 to 20 carbon atoms and may have an alkyl group or an alkoxy group as a substituent, X denotes a monovalent group expressed by the following Structural Formula (I), (II) or (III), and Y denotes a phenyl group which may have an alkyl group or an alkoxy group as a substituent, Structural Formula (I)

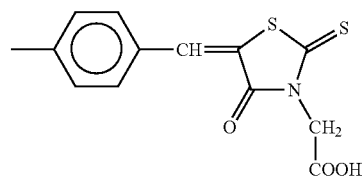

Structural Formula (II)

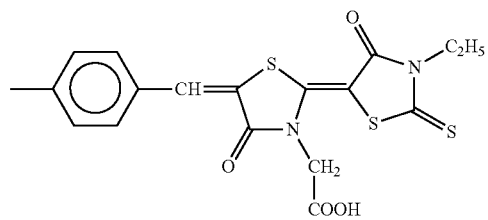

-continued

Structural Formula (III)

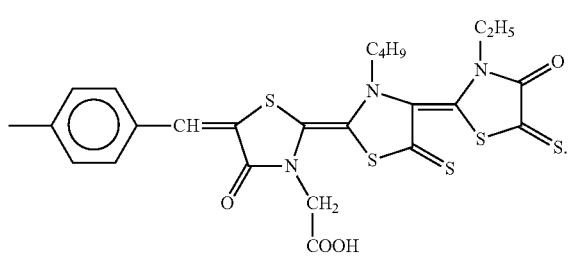

<2> The photoelectric conversion element according to <1>, wherein the porphyrin compound represented by the General Formula (1) is represented by the following General Formula (1-1):

General Formula (1-1)

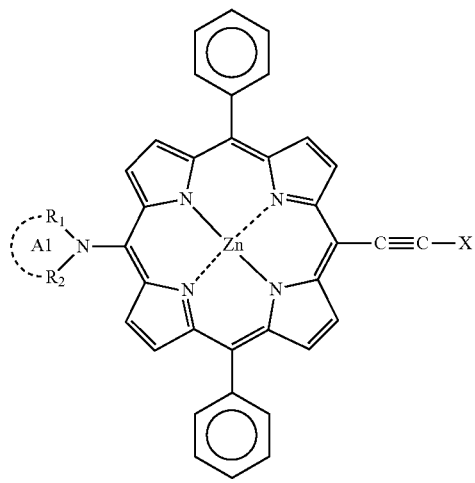

where in the General Formula (1-1), $R_1$, $R_2$, A1, and X are as defined in the General Formula (1).

<3> The photoelectric conversion element according to <1>, wherein the porphyrin compound represented by the General Formula (2) is represented by the following General Formula (2-1):

General Formula (2-1)

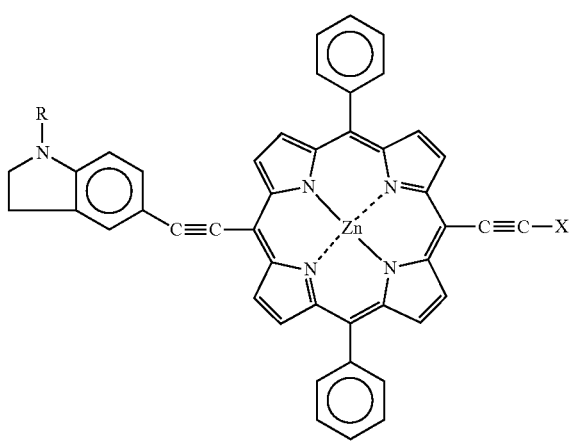

where in the General Formula (2-1), R and X are as defined in the General Formula (2).

<4> The photoelectric conversion element according to any one of <1> to <3>, wherein the electron transporting material is an n-type oxide semiconductor of nanoparticles.

<5> The photoelectric conversion element according to <4>, wherein the n-type oxide semiconductor is titanium oxide, zinc oxide, tin oxide, niobium oxide, or any combination thereof.

<6> The photoelectric conversion element according to any one of <1> to <5>, wherein the electron transporting material is coated with the porphyrin compound in a supercritical carbon dioxide fluid.

<7> The photoelectric conversion element according to <6>, wherein a pressure of the supercritical carbon dioxide fluid is 15 MPa to 45 MPa, and a temperature of the supercritical carbon dioxide fluid is 35° C. to 60° C.

<8> A solar cell, including:
a first electrode;
an electron transporting layer on the first electrode; and
a second electrode facing the electron transporting layer,
wherein the electron transporting layer includes the photoelectric conversion element according to any one of <1> to <7>.

REFERENCE SIGNS LIST

1 Substrate
2 First electrode
3 Electron transporting layer
4 Photosensitizing compound
5 Charge transfer layer
6 Second electrode
7, 8 Lead line

The invention claimed is:
1. A photoelectric conversion element, comprising:
an electron transporting material; and
a porphyrin compound represented by the following General Formula (1) or the following General Formula (2),
wherein the electron transporting material is coated with the porphyrin compound:

General Formula (1)

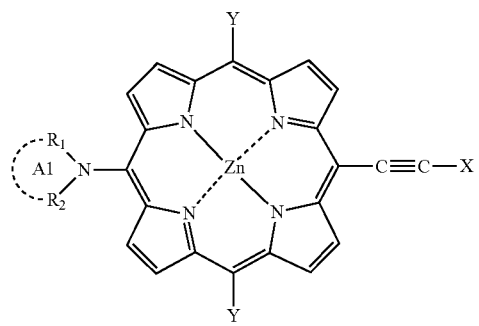

where in General Formula (1), $R_1$ and $R_2$ each independently denote an aromatic hydrocarbon group which has 6 to 20 carbon atoms and may have an alkyl group or an alkoxy group as a substituent, $R_1$ and $R_2$ may be bonded together to form a ring structure denoted by A1, X denotes a monovalent group expressed by the following Structural Formula (I), (II) or (III), and Y denotes a phenyl group which may have an alkyl group or an alkoxy group as a substituent, General Formula (2)

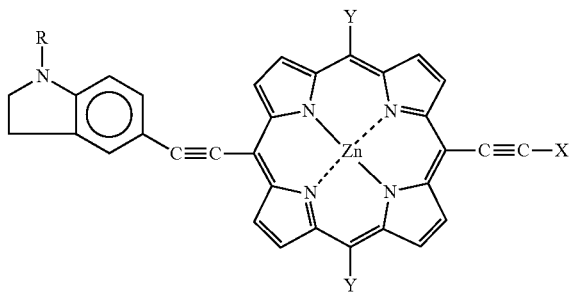

where in General Formula (2), R denotes an aromatic hydrocarbon group which has 6 to 20 carbon atoms and may have an alkyl group or an alkoxy group as a substituent, X denotes a monovalent group expressed by the following Structural Formula (I), (II) or (III), and Y denotes a phenyl group which may have an alkyl group or an alkoxy group as a substituent, Structural Formula (I)

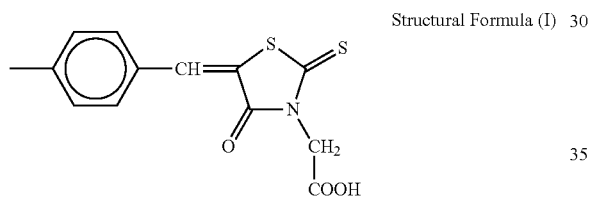

Structural Formula (II)

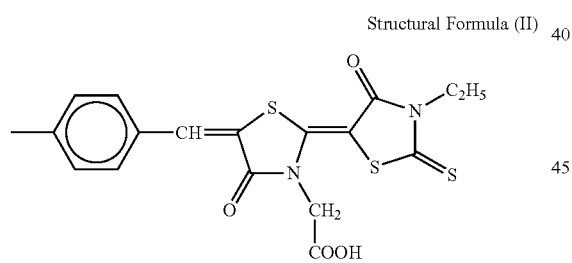

Structural Formula (III)

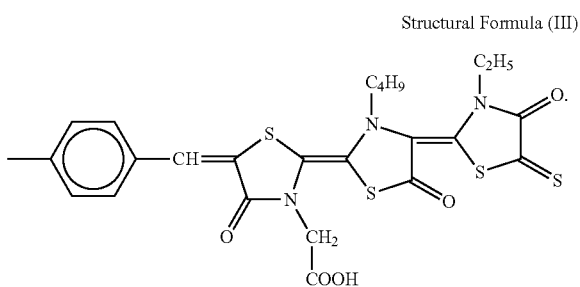

2. The photoelectric conversion element according to claim 1, wherein the porphyrin compound represented by the General Formula (1) is represented by the following General Formula (1-1):

General Formula (1-1)

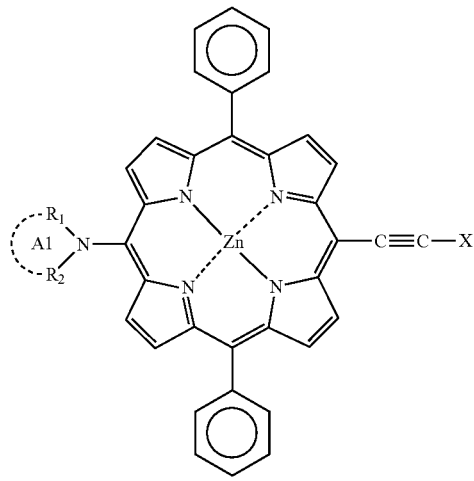

where in the General Formula (1-1), $R_1$, $R_2$, A1, and X are as defined in the General Formula (1).

3. The photoelectric conversion element according to claim 1, wherein the porphyrin compound represented by the General Formula (2) is represented by the following General Formula (2-1):

General Formula (2-1)

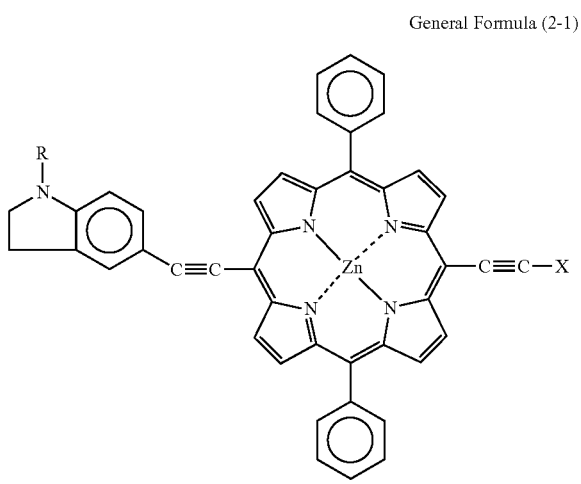

where in the General Formula (2-1), R and X are as defined in the General Formula (2).

4. The photoelectric conversion element according to claim 1, wherein the electron transporting material is an n-type oxide semiconductor of nanoparticles.

5. The photoelectric conversion element according to claim 4, wherein the n-type oxide semiconductor of nanoparticles is titanium oxide, zinc oxide, tin oxide, niobium oxide, or any combination thereof.

6. The photoelectric conversion element according to claim 1, wherein the electron transporting material is coated with the porphyrin compound in a supercritical carbon dioxide fluid.

7. The photoelectric conversion element according to claim 6, wherein a pressure of the supercritical carbon dioxide fluid is 15 MPa to 45 MPa, and a temperature of the supercritical carbon dioxide fluid is 35° C. to 60° C.

8. A solar cell, comprising:
a first electrode;
an electron transporting layer on the first electrode; and
a second electrode facing the electron transporting layer,
wherein the electron transporting layer comprises a photoelectric conversion element,
wherein the photoelectric conversion element comprises:
an electron transporting material; and
a porphyrin compound represented by the following General Formula (1) or the following General Formula (2),
wherein the electron transporting material is coated with the porphyrin compound:

General Formula (1)

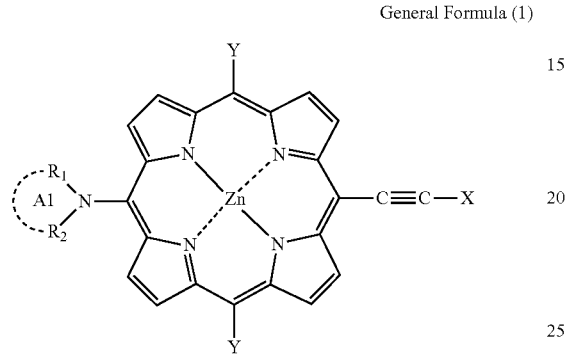

where in General Formula (1), $R_1$ and $R_2$ each independently denote an aromatic hydrocarbon group which has 6 to 20 carbon atoms and may have an alkyl group or an alkoxy group as a substituent, $R_1$ and $R_2$ may be bonded together to form a ring structure denoted by A1, X denotes a monovalent group expressed by the following Structural Formula (I), (II) or (III), and Y denotes a phenyl group which may have an alkyl group or an alkoxy group as a substituent, General Formula (2)

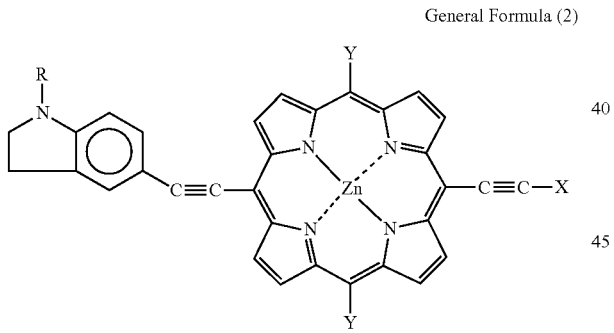

where in General Formula (2), R denotes an aromatic hydrocarbon group which has 6 to 20 carbon atoms and may have an alkyl group or an alkoxy group as a substituent, X denotes a monovalent group expressed by the following Structural Formula (I), (II) or (III), and Y denotes a phenyl group which may have an alkyl group or an alkoxy group as a substituent, Structural Formula (I)

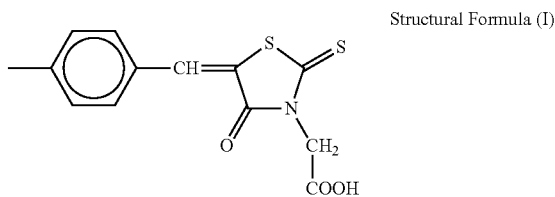

Structural Formula (II)

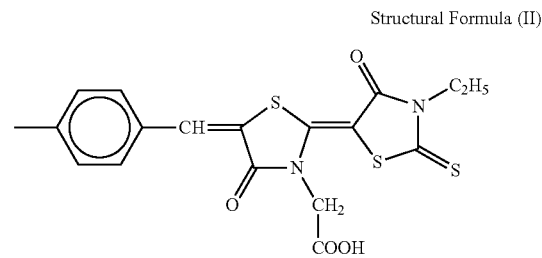

Structural Formula (III)

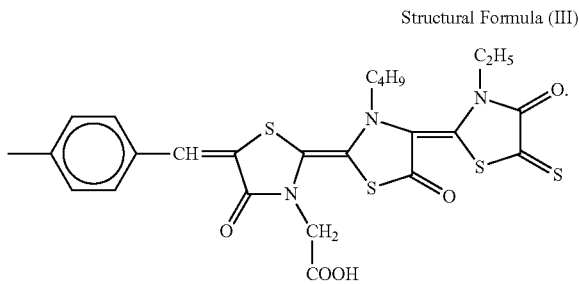

* * * * *